United States Patent
Chang et al.

(10) Patent No.: US 10,978,301 B2
(45) Date of Patent: Apr. 13, 2021

(54) MORPHOLOGY OF RESIST MASK PRIOR TO ETCHING

(71) Applicant: Taiwan Semiconductor Manufacturing Company, Ltd., Hsinchu (TW)

(72) Inventors: Ching-Yu Chang, Taipei (TW); Jung-Hau Shiu, New Taipei (TW); Wei-Ren Wang, New Taipei (TW); Shing-Chyang Pan, Jhudong Township (TW); Tze-Liang Lee, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 130 days.

(21) Appl. No.: 16/118,851

(22) Filed: Aug. 31, 2018

(65) Prior Publication Data
US 2020/0075319 A1    Mar. 5, 2020

(51) Int. Cl.
*H01L 21/027* (2006.01)
*H01L 21/02* (2006.01)
(Continued)

(52) U.S. Cl.
CPC ...... *H01L 21/0273* (2013.01); *H01L 21/0206* (2013.01); *H01L 21/0228* (2013.01); *H01L 21/0275* (2013.01); *H01L 21/0276* (2013.01); *H01L 21/02205* (2013.01); *H01L 21/0332* (2013.01); *H01L 21/0337* (2013.01); *H01L 21/0338* (2013.01); *H01L 21/31144* (2013.01); *H01L 21/76802* (2013.01); *H01L 21/76877* (2013.01); *H01L 21/31058* (2013.01);
(Continued)

(58) Field of Classification Search
None
See application file for complete search history.

(56) References Cited

U.S. PATENT DOCUMENTS

| | | | | |
|---|---|---|---|---|
| 5,296,410 A | * | 3/1994 | Yang | H01L 21/0337 257/E21.038 |
| 5,362,606 A | | 11/1994 | Hartney et al. | |

(Continued)

FOREIGN PATENT DOCUMENTS

| | | |
|---|---|---|
| TW | 505984 B | 10/2002 |
| TW | 201144375 A | 12/2011 |
| TW | 201627238 A | 8/2016 |

OTHER PUBLICATIONS

Ki-Ho Baik, L., et al., "Comparative study between gas- and liquid-phase silylation for the diffusion-enhanced silylated resist process," J. Vac. Sci. Technology B, 1991, 9(6), p. 3399-3400.
(Continued)

*Primary Examiner* — Andres Munoz
(74) *Attorney, Agent, or Firm* — Slater Matsil, LLP

(57) ABSTRACT

Embodiments provide a patterning process. A photoresist layer is patterned. At least portions of the photoresist layer are converted from an organic material to an inorganic material by a deposition process of a metal oxide. All or some of the patterned photoresist layer may be converted to a carbon-metal-oxide. A metal oxide crust may be formed over the patterned photoresist layer. After conversion, the patterned photoresist layer is used as an etch mask to etch an underlying layer.

20 Claims, 35 Drawing Sheets

(51) Int. Cl.
- *H01L 21/033* (2006.01)
- *H01L 21/768* (2006.01)
- *H01L 21/311* (2006.01)
- *H01L 21/8234* (2006.01)
- *H01L 29/66* (2006.01)
- *H01L 21/3105* (2006.01)

(52) U.S. Cl.
CPC .... *H01L 21/7684* (2013.01); *H01L 21/76816* (2013.01); *H01L 21/76846* (2013.01); *H01L 21/823431* (2013.01); *H01L 21/823437* (2013.01); *H01L 21/823475* (2013.01); *H01L 29/66545* (2013.01); *H01L 29/66795* (2013.01)

(56) References Cited

U.S. PATENT DOCUMENTS

| | | | |
|---|---|---|---|
| 6,103,596 A * | 8/2000 | Peng | G03F 7/405 |
| | | | 257/E21.024 |
| 6,458,516 B1 | 10/2002 | Ye et al. | |
| 8,449,785 B2 * | 5/2013 | Kondo | H01L 21/0332 |
| | | | 216/41 |
| 8,603,732 B2 | 12/2013 | Ogihara et al. | |
| 8,764,995 B2 | 7/2014 | Chang et al. | |
| 8,796,666 B1 | 8/2014 | Huang et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 9,012,132 B2 | 4/2015 | Chang | |
| 9,028,915 B2 | 5/2015 | Chang et al. | |
| 9,093,530 B2 | 7/2015 | Huang et al. | |
| 9,146,469 B2 | 9/2015 | Liu et al. | |
| 9,184,054 B1 | 11/2015 | Huang et al. | |
| 9,213,234 B2 | 12/2015 | Chang | |
| 9,223,220 B2 | 12/2015 | Chang | |
| 9,256,123 B2 | 2/2016 | Shih et al. | |
| 9,256,133 B2 | 2/2016 | Chang | |
| 9,529,268 B2 | 12/2016 | Chang et al. | |
| 9,536,759 B2 | 1/2017 | Yang et al. | |
| 9,548,303 B2 | 1/2017 | Lee et al. | |
| 2004/0072430 A1 * | 4/2004 | Huang | H01L 21/31144 |
| | | | 438/689 |
| 2005/0266356 A1 * | 12/2005 | Koh | H01L 21/0274 |
| | | | 430/323 |
| 2006/0205220 A1 * | 9/2006 | Hudson | H01L 21/32139 |
| | | | 438/694 |
| 2007/0284337 A1 * | 12/2007 | Mochizuki | H01L 21/0337 |
| | | | 216/67 |
| 2008/0020585 A1 * | 1/2008 | Shimizu | H01L 21/31138 |
| | | | 438/725 |
| 2019/0109010 A1 * | 4/2019 | Lee | H01L 21/0274 |
| 2019/0198338 A1 * | 6/2019 | Kim | H01L 21/02164 |
| 2019/0378725 A1 * | 12/2019 | Abatchev | H01L 21/32137 |
| 2019/0393105 A1 * | 12/2019 | Cho | C23C 16/45542 |

OTHER PUBLICATIONS

Quirk, et al., "Semiconductor manufacturing technology," Library of Congress Cataloging-in-Publication Data, Photolithography: Photoresist Development and Advanced Lithography, ISBN 0-13-081520-9, 2001 Figs. 15, 16, pp. 428-429.

* cited by examiner

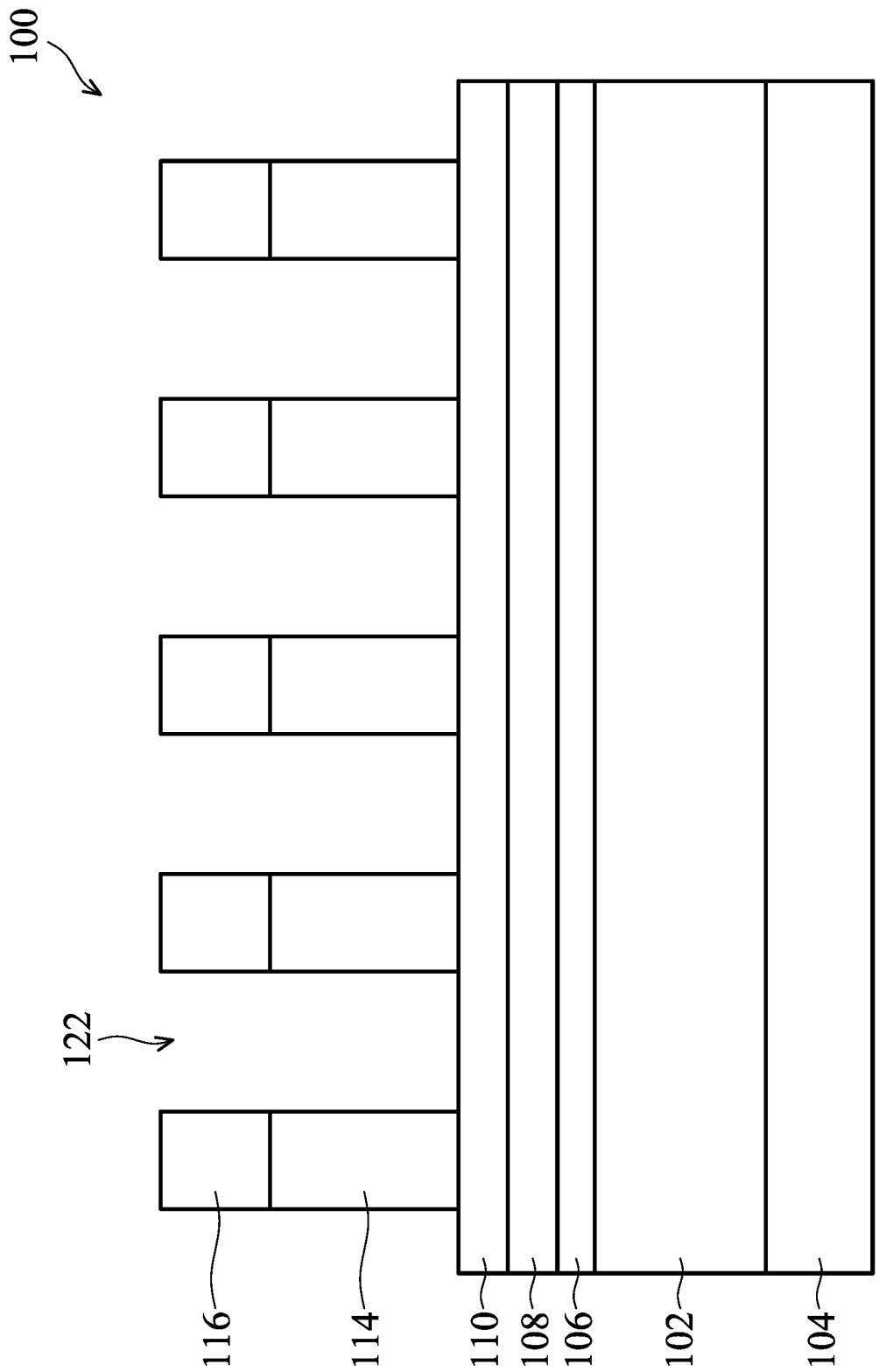

MORPHOLOGY OF RESIST MASK PRIOR TO ETCHING

BACKGROUND

With the increasing down-scaling of semiconductor devices, various processing techniques (e.g., photolithography) are adapted to allow for the manufacture of devices with increasingly smaller dimensions. For example, as the density of gates increases, the manufacturing processes of various features in the device (e.g., overlying interconnect features) are adapted to be compatible with the down-scaling of device features as a whole. However, as semiconductor processes have increasingly smaller process windows, the manufacture of these devices have approached and even surpassed the theoretical limits of photolithography equipment. As semiconductor devices continue to shrink, the spacing desired between elements (i.e., the pitch) of a device is less than the pitch that can be manufactured using traditional optical masks and photolithography equipment.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A, 2B, 2C, 3A, 3B, 3C, 4A, 4B, and 4C illustrate cross-sectional views of various intermediary stages of manufacturing a semiconductor device in accordance with some embodiments.

DETAILED DESCRIPTION

Figure 1:
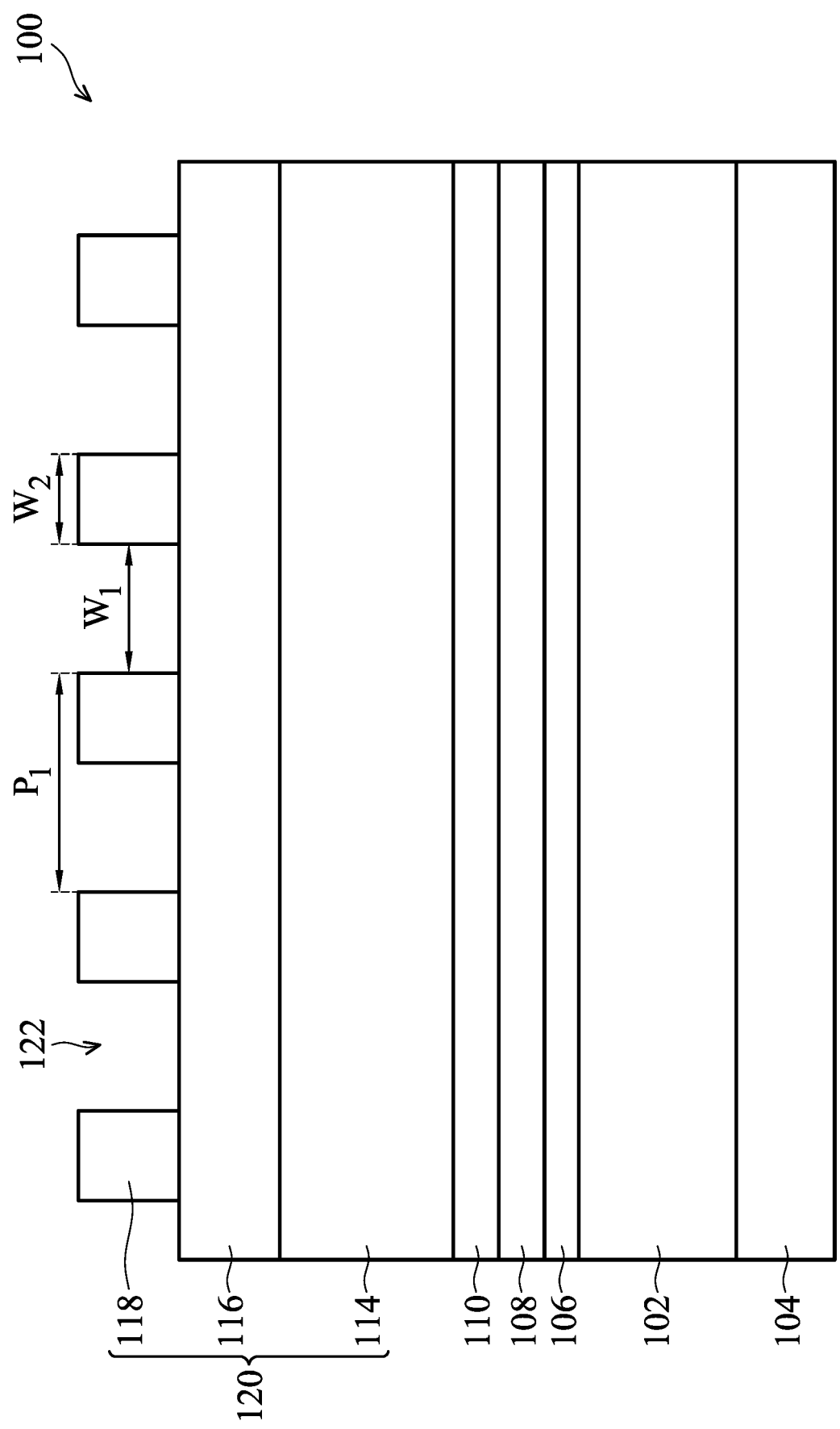
FIG. 1 illustrates a cross-sectional view of an intermediary stage of manufacturing a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments are described in respect to a single patterning process. However, various embodiments may be directed at other patterning processes, such as, self-aligned double patterning (SADP), self-aligned quadruple patterning (SAQP), and the like.

To achieve narrow line width directly in a single patterning process, extreme ultra-violet (EUV) as a light source may be used in a photolighography process. EUV can, for example, provide a light source of 13.5 nm, by a process of vaporizing tin droplets by a $CO_2$ laser in an EUV source chamber, gathering scattered EUV photon radiation produced as a result of the vaporization, focusing the EUV radiation, and projecting it through a pattern to a stage holding a semiconductor device. One issue faced in this process, however, is the possibility of photoresist collapse. If the photoresist layer is too thick, the pattern can collapse, which would create breaks in the intended pattern. To avoid photoresist collapse with a high aspect ratio of height to width of patterned openings, the thickness of the photoresist should be as thin as possible. However, a thin photoresist decreases the etching window, resulting in the risk of pattern bridging. Compared to typical photolithographic processes using organic sacrificial materials formed by a spin-on process, embodiments convert all or part of an organic photoresist mask to an inorganic mask, increasing the etching window, resulting in fewer defects in the target layer. Thus, fine pitched semiconductor structures can be manufactured with improved yield.

A semiconductor device and method are provided in accordance with some embodiments. In particular, a patterning process is performed to pattern lines in a semiconductor device. Photolithographic processes are used to pattern an underlying target layer. The underlying target layer may be a layer used for a variety of purposes. For example, the target layer may be a low-k dielectric layer, in which openings are patterned using the mask layer. Subsequently, conductive material(s) may be filled in the openings of the low-k dielectric layer to define interconnect lines.

FIGS. 1 through 17 illustrate cross-sectional views of intermediate stages in the formation of features in a target layer 102 on a semiconductor device 100, in accordance with various embodiments. The target layer 102 is a layer in which a plurality of patterns is to be formed in accordance with embodiments of the present disclosure. In some embodiments, semiconductor device 100 is processed as part of a larger wafer. In such embodiments, after various features of the semiconductor device 100 is formed (e.g., active devices, interconnect structures, and the like), a singulation process may be applied to scribe line regions of the wafer in order to separate individual semiconductor dies from the wafer (also referred to as singulation).

In some embodiments, the target layer 102 is an intermetal dielectric (IMD) layer. In such embodiments, the target layer 102 comprises a low-k dielectric material having a dielectric constant (k value) lower than 3.8, lower than about 3.0, or lower than about 2.5, for example. In alternative embodiments, target layer 102 is an IMD layer comprising high-k dielectric material having a k value higher than 3.8. Openings may be patterned in the target layer 102 with the embodiment processes, and conductive lines and/or vias may be formed in the openings as described below.

In other embodiments, the target layer 102 is a semiconductor substrate. The semiconductor substrate may be formed of a semiconductor material such as silicon, silicon germanium, or the like. In some embodiments, the semiconductor substrate is a crystalline semiconductor substrate such as a crystalline silicon substrate, a crystalline silicon carbon substrate, a crystalline silicon germanium substrate, a III-V compound semiconductor substrate, or the like. The semiconductor substrate may be patterned with an embodiment process, and subsequent process steps may be used to form shallow trench isolation (STI) regions in the substrate. Semiconductor fins may protrude from between the formed STI regions. Source/drain regions may be formed in the semiconductor fins, and gate dielectric and electrode layers may be formed over channels regions of the fins, thereby forming semiconductor devices such as fin field effect transistors (finFETs).

In still other embodiments, the target layer 102 is a conductive layer, such as, a metal layer or a polysilicon layer, which is blanket deposited. Embodiment patterning processes may be applied to the target layer 102 in order to pattern semiconductor gates and/or dummy gates of finFETS. By using embodiment processes to pattern a conductive target layer 102, spacing between adjacent gates may be reduced and gate density may be increased.

In FIG. 1, a film stack including the target layer 102 is formed in semiconductor device 100. In some embodiments, the target layer 102 may be formed over a semiconductor substrate 104. The semiconductor substrate 104 may be formed of a semiconductor material such as silicon, doped or undoped, or an active layer of a semiconductor-on-insulator (SOI) substrate. The semiconductor substrate 104 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices (not illustrated), such as transistors, diodes, capacitors, resistors, etc., may be formed in and/or on an active surface of semiconductor substrate 104. In other embodiments where the target layer 102 is a semiconductor substrate used to form finFETs, the semiconductor substrate 104 may be omitted.

Although FIG. 1 illustrates target layer 102 being in physical contact with semiconductor substrate 104, any number of intervening layers may be disposed between target layer 102 and semiconductor substrate 104. Such intervening layers may include an inter-layer dielectric (ILD) layer comprising a low-k dielectric and having contact plugs formed therein, other IMD layers having conductive lines and/or vias formed therein, one or more intermediary layers (e.g., etch stop layers, adhesion layers, etc.), combinations thereof, and the like. For example, an optional etch stop layer (not illustrated) may be disposed directly under the target layer 102. The etch stop layer may act as a stop for an etching process subsequently performed on the target layer 102. The material and process used to form the etch stop layer may depend on the material of the target layer 102. In some embodiments, the etch stop layer may be formed of silicon nitride, SiON, SiCON, SiC, SiOC, $SiC_xN_y$, $SiO_x$, other dielectrics, combinations thereof, or the like, and may be formed by plasma enhanced chemical vapor deposition (PECVD), low pressure CVD (LPCVD), physical vapor deposition (PVD), or the like.

The film stack further includes an anti-reflective coating (ARC) 106 formed over the target layer 102. The ARC 106 aids in the exposure and focus of overlying photoresist layers (discussed below) during patterning of the photoresist layers. In some embodiments, the ARC 106 may be formed from SiON, silicon carbide, materials doped with oxygen (O) and nitrogen (N), or the like. In some embodiments, the ARC 106 is substantially free from nitrogen, and may be formed from an oxide. In such embodiments, the ARC 106 may be also referred to as a nitrogen-free ARC (NFARC). The ARC 106 may be formed by Plasma Enhance Chemical Vapor Deposition (PECVD), High-Density Plasma (HDP) deposition, or the like.

The film stack further includes a hard mask layer 108 formed over the ARC 106 and the target layer 102. The hard mask layer 108 may be formed of a material that comprises a metal (e.g., titanium nitride, titanium, tantalum nitride, tantalum, a metal-doped carbide (e.g., tungsten carbide), or the like) and/or a metalloid (e.g., silicon nitride, boron nitride, silicon carbide, or the like), and may be formed by PVD, Radio Frequency PVD (RFPVD), Atomic Layer Deposition (ALD), or the like. In subsequent processing steps, a pattern is formed on the hard mask layer 108 using an embodiment patterning process. The hard mask layer 108 is then used as an etching mask for etching the target layer 102, where the pattern of the hard mask layer 108 is transferred to the target layer 102.

The film stack further includes a dielectric layer 110 formed over the hard mask layer 108. The dielectric layer 110 may be a silicon oxide, and may be formed from borophosphosilicate tetraethylortho silicate (BPTEOS) or undoped tetraethylorthosilicate (TEOS), or formed by CVD, ALD, spin-on coating, or the like. In some embodiments, the dielectric layer 110 acts as an etch stop layer for patterning a bottom layer of a bi-layer or tri-layer photoresist mask. In some embodiments including a multiple patterning process, the dielectric layer 110 acts as an etch stop layer for patterning subsequently formed mandrels and/or spacers in a mandrel/spacer layer (not shown) overlying the dielectric layer 110. In some embodiments, the dielectric layer 110 also acts as an anti-reflective coating.

A tri-layer photoresist 120 is formed on the film stack over the dielectric layer 110. The tri-layer photoresist 120 includes a bottom layer 114, a middle layer 116 over the bottom layer 114, and an upper layer 118 over the middle layer 116. The bottom layer 114 and upper layer 118 may be formed of photoresists (e.g., photosensitive materials), which include organic materials. In some embodiments, the bottom layer 114 may also be a bottom anti-reflective coating (BARC) layer.

The middle layer 116 may comprise an inorganic material, which may be a nitride (such as silicon nitride), an oxynitride (such as silicon oxynitride), an oxide (such as silicon oxide), combinations of these or the like. The middle layer 116 may have a high etching selectivity relative to the upper layer 118 (after modification as described below) and the bottom layer 114. The various layers of the tri-layer photoresist 120 may be blanket deposited sequentially using, for example, spin-on processes. Other suitable deposition process may be used, such as CVD, ALD, PVD, or the like.

Although a tri-layer photoresist 120 is discussed, in other embodiments, the photoresist 120 may be a monolayer or a bilayer (e.g., comprising only the bottom layer 114 and the upper layer 118 without the middle layer 116) photoresist. The type of photoresist used (e.g., monolayer, bilayer, or tri-layer) may depend on the photolithography process used to pattern the target layer 102 or mandrel/spacer layer overlying the dielectric layer 110.

The upper layer 118 is patterned using a photolithographic process, as discussed in greater detail below. Subsequently, the upper layer 118 is converted using embodiment processes (see e.g., FIGS. 2A-2C, 6A-6C, and 10A-10C) and used as an etching mask for patterning of the middle layer 116 (see e.g., FIGS. 3A-3C, 7A-7C, and 11A-11C). The middle layer 116 is then used as an etching mask for patterning of the bottom layer 114 (see e.g., FIGS. 3A-3C, 7A-7C, and 11A-11C). The bottom layer 114 is then used to pattern the dielectric layer 110 (see FIG. 13), the dielectric layer 110 is then used to pattern the hard mask layer 108 (see FIG. 14), the hard mask layer 108 is then used to pattern the ARC 106 (see FIG. 15) and the target layer 102 (see FIG. 16).

Although a tri-layer photoresist (e.g., tri-layer photoresist 120) may have some advantages over a bi-layer photoresist or monolayer photoresist, embodiment processes may provide improved definition in fine-pitched patterns to etch a target layer (e.g., target layer 102) by converting some or all of the patterned organic photo-patternable material of upper layer 118 into an inorganic material.

The upper layer 118 is patterned using any suitable photolithography process to form openings 122 therein. To achieve narrow line widths directly in a single patterning process, EUV may be used as a light source in the photolighography process. As an example of patterning openings 122 in the upper layer 118, a photomask (not shown) may be disposed between a radiation beam and the upper layer 118. The upper layer 118 may then be exposed to the radiation beam. In some embodiments, the radiation beam may include an radiation source, such as EUV, an ultraviolet (UV) or an excimer laser such as a 248 nm beam from a Krypton Fluoride (KrF) excimer laser, a 193 nm beam from an Argon Fluoride (ArF) excimer laser, or a 157 nm beam from a $F_2$ excimer laser, or the like while the photomask masks areas of the upper layer 118. Exposure of the upper layer 118 may be performed using an immersion lithography system to increase resolution and decrease the minimum achievable pitch. A bake or cure operation may be performed to harden the upper layer 118, and a developer may be used to remove either the exposed or unexposed portions of the upper layer 118 depending on whether a positive or negative resist is used.

The openings 122 may have strip shapes in a plan view (not illustrated). The pitch $P_1$ of the openings 122 may be the minimum pitch achievable using photolithographic processes alone. For example, in some embodiments, the pitch $P_1$ of the openings 122 is between about 10 nm and 100 nm, such as about 20 nm. Other pitches $P_1$ of the openings 122 are also contemplated. The width $W_1$ of the openings 122 may be between about 5 nm and 50 nm, such as about 10 nm, and the width $W_2$ of discrete remaining portions of the upper layer 118, may be between about 5 nm and 50 nm, such as about 10 nm. Other values of $W_1$ and $W_2$ are also contemplated.

After the patterning of the upper layer 118, the upper layer 118 may be processed to convert some or all of the upper layer 118 into an inorganic material. Or, in other words, inorganic materials may be added to the upper layer 118. After converting the upper layer 118, the etching window will be increased and the selectivity between the upper layer 118 and the middle layer 116 is increased. Optionally, prior to converting some or all of the upper layer 118 to an inorganic material, a de-scum process (see, e.g., FIG. 5) or trimming process (see, e.g., FIG. 9) may be performed.

Figure 2A:
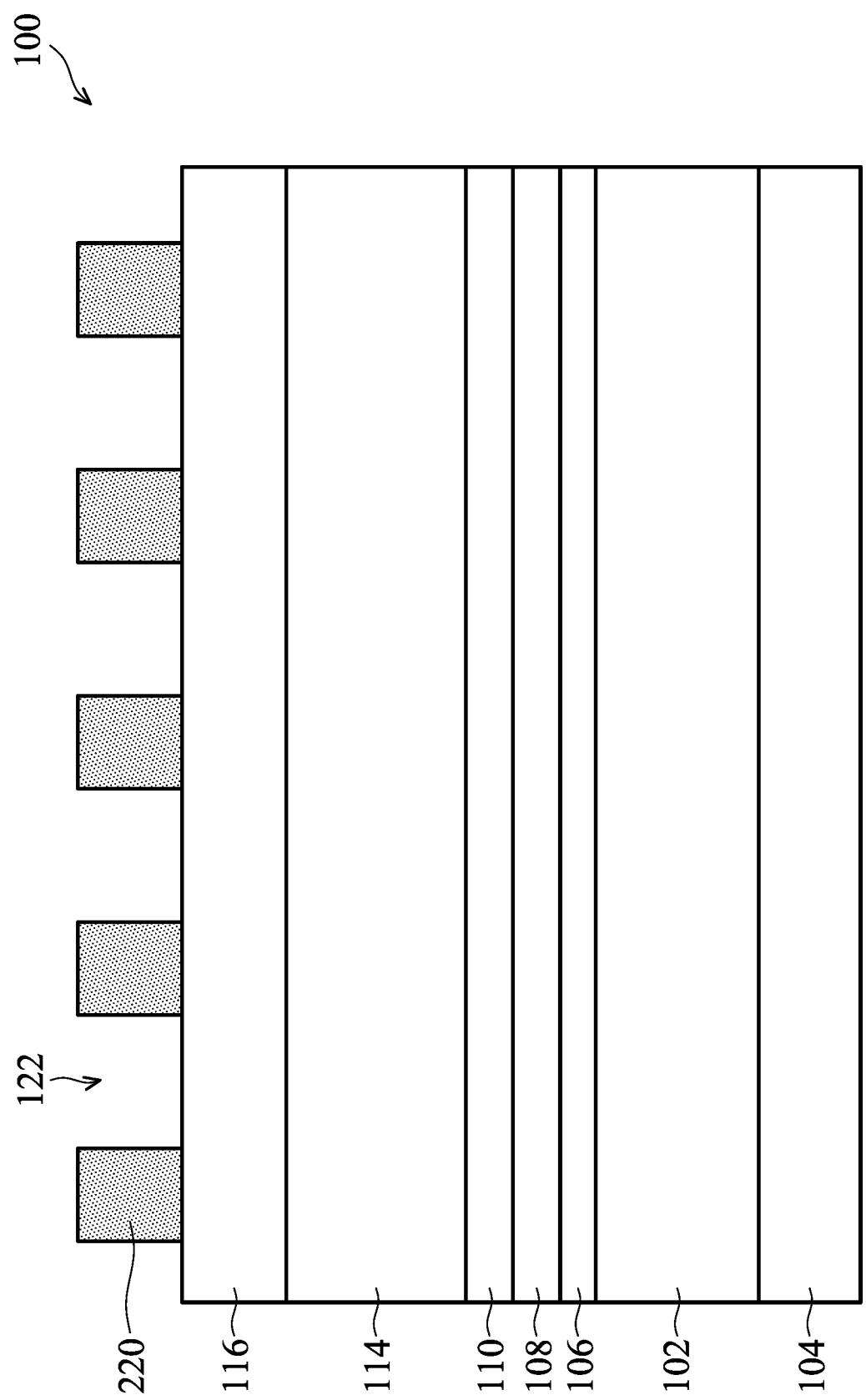
Figure 2B:
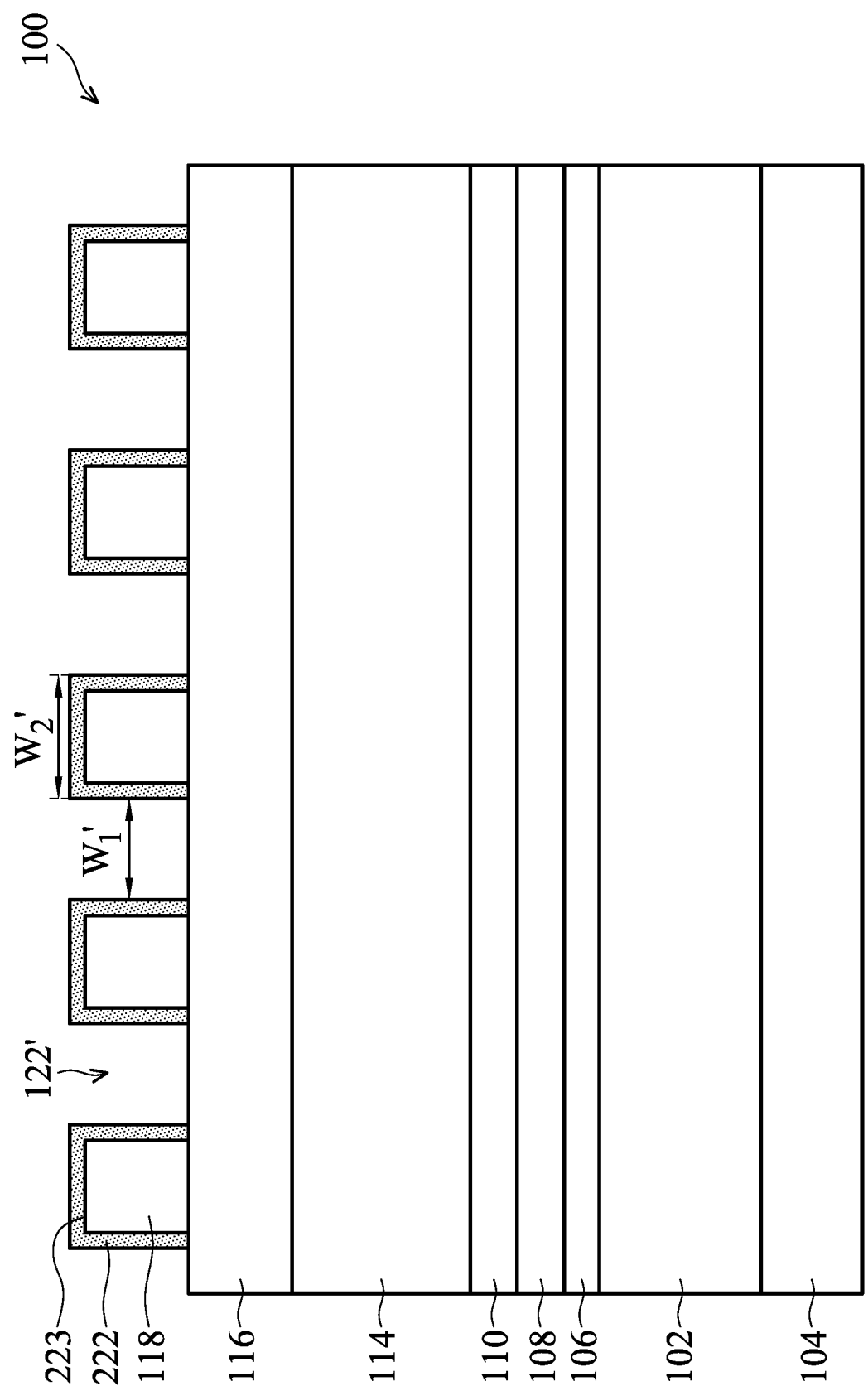
Figure 2C:
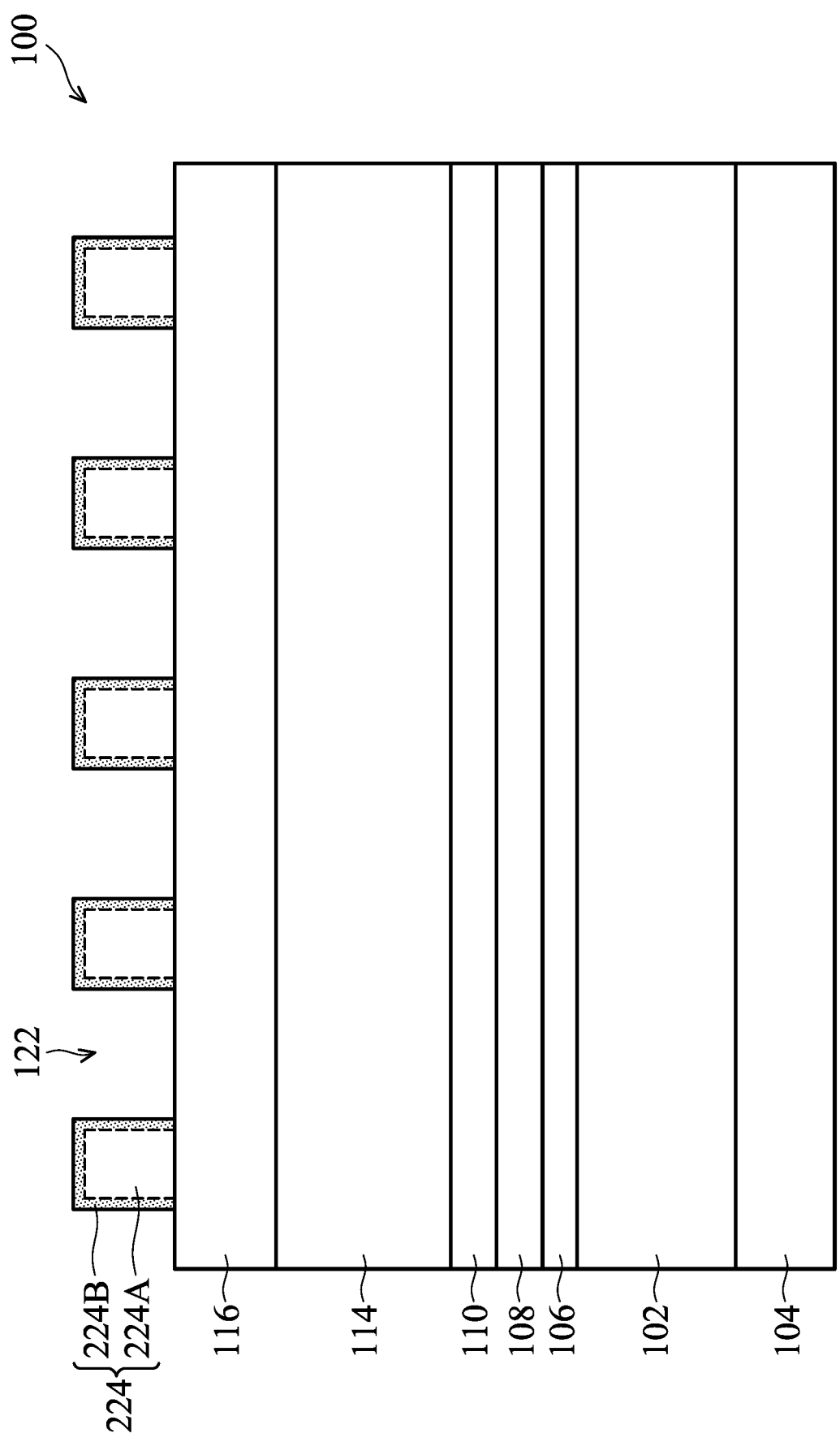

FIGS. 2A through 2C illustrate three different morphologies of the upper layer 118 in accordance with process embodiments. FIG. 2A illustrates a morphology of the upper layer 118 where the upper layer 118 is converted to a mask layer 220 comprising a uniform morphology of a metal-oxide-photoresist material. FIG. 2B illustrates a morphology of the upper layer 118 where a metal oxide crust 222 is formed which has a uniform cross-link to the photoresist material of the upper layer 118. FIG. 2C illustrates a morphology of the upper layer 118 where the upper layer 118 is converted to a mask layer 224 having an outer layer 224B which is converted from the upper layer 118 to a metal-oxide-photoresist material and an inner layer 224A which is an unconverted portion of the upper layer 118.

In FIG. 2A, a thermal ALD process may be used to deposit a metal based composite material onto or into the photoresist material of the upper layer 118, thereby converting the upper layer 118 into the mask layer 220. The metal composite material (MeOx) formed in the photoresist may be selected from the oxide variants of AlOx, TiOx, ZrOx, ZnOx, SnOx, SiOx, and combinations thereof.

In the thermal ALD process, a metal precursor reacts with the carbon oxygen (C=O) bonds in the organic photoresist material to produce bonds including the metal oxide, resulting in a carbon-metal-oxide inorganic material. The ALD process uses alternating precursors to achieve a thin film deposition. As shown in FIG. 2A, the thin film deposition may penetrate through the entirety of the upper layer 118. The first precursor is chosen so that it will only react with the materials of the upper layer 118 and not the middle layer 116. The second precursor may have a minimal reaction with the middle layer 116, however, because the first precursor does not react with the middle layer 116, a film does not form on the exposed portions (through the openings 122) of the middle layer 116.

Candidates for the first reacting precursor include trimethylaluminum (TMA, $Al(CH_3)_3$), diethylzinc (DEZ), tetrakis (dimethylamino) titanium (TDMAT), titanium isopropoxide (TTIP), $TiCl_4$, bis(tertiary-butyl-amino) silane (BTBAS), bis(diethylamino)silane (BDEAS), tris(dimethylamino)silane (3DMAS), tetrakis(dimethylamido)zirconium ($Zr(NMe_2)_4$), or zirconium tetrachloride ($ZrCl_4$), or tetrakis-dimethyl-amine tin (TDMASn). Other suitable first reacting precursors may be used. Reaction gas candidates for the second reacting precursor include an oxygen source (such as, $H_2O$, $O_2$, $O_3$, $H_2O_2$) or other suitable compounds for reacting with first precursor.

The process temperature may be below about 250° C., to encourage molecular debonding and rebonding of the materials and conversion of the upper layer 118 to mask 220. In some embodiments, the temperature should be kept low enough to (e.g., lower than about 200° C.) to avoid decomposition of the material of upper layer 118. The process temperature may be tunable to achieve a desired morphology of the upper layer 118. For example, a higher temperature may contribute to achieving a morphology of the upper layer 118 similar to or closer to the morphology illustrated in FIG. 2A.

The process flow rate of the first precursor may be between about 100 sccm and about 3000 sccm, such as about 500 sccm. The process flow rate may be tunable to achieve a desired morphology of the upper layer 118. For example, a lower flow rate of the first precursor may contribute to achieving a morphology of the upper layer 118 similar to or closer to the morphology illustrated in FIG. 2A. The process flow rate of the second precursor may be between about 100 sccm and about 3000 sccm, such as about 500 sccm. The process flow rate of the second precursor may also be tunable, similar to the process flow rate of the first precursor.

The feed time of the first precursor may be between about 0.05 s and 10 s, such as about 1 s. The feed time of the second precursor may be between about 0.05 s and 10 s, such as about 1 s. The pressure for the process may be held to be between about 100 mTorr and about 10000 mTorr, such as about 1000 mTorr. In some embodiments, a number of repeating pulses of the first precursor and second precursor may be made until the desired morphology is reached. The number of repeating pulses used to achieve the morphology depicted in FIG. 2A may be between about 1 and 100, such as about 10. Other tunable parameters may be used to achieve a desired morphology of the upper layer 118.

FIG. 2B illustrates a morphology of the upper layer 118 where a metal oxide crust 222 is formed which has a uniform cross-link 223 to the photoresist material of the upper layer 118. A thermal ALD process may be used to deposit a metal based composite material into a surface portion of the photoresist material of the upper layer 118, thereby forming a uniform cross-link 223 from the photoresist material of the upper layer 118 to the metal oxide crust 222.

Similar to the process described above with respect to FIG. 2A, in the thermal ALD process, a metal precursor reacts with the carbon oxygen (C=O) bonds in the organic photoresist material to produce bonds including the metal oxide, resulting in a carbon-metal-oxide inorganic material. In the embodiment of FIG. 2B, however, the carbon-metal-oxide inorganic material is a uniform cross-link at the surface of the upper layer 118. The ALD process uses alternating precursors to achieve a thin film deposition. As shown in FIG. 2B, the thin film deposition may penetrate a surface of the upper layer 118 to convert the surface to a carbon-metal-oxide inorganic material.

The process temperature may be below about 250° C., to encourage molecular debonding and rebonding of the materials and conversion of the upper layer 118 to mask 222. In some embodiments, the temperature should be kept low enough to (e.g., lower than about 200° C.) to avoid decomposition of the material of upper layer 118. The process temperature may be tunable to achieve a desired morphology of the upper layer 118.

The process flow rate of the first precursor may be between about 100 sccm and about 3000 sccm, such as about 500 sccm. The process flow rate may be tunable to achieve a desired morphology of the upper layer 118. The process flow rate of the second precursor may be between about 100 sccm and about 3000 sccm, such as about 500 sccm. The process flow rate of the second precursor may also be tunable, similar to the process flow rate of the first precursor.

The feed time of the first precursor may be between about 0.05 s and 10 s, such as about 1 s. The feed time of the second precursor may be between about 0.05 s and 10 s, such as about 1 s. The pressure for the process may be held to be between about 100 mTorr and about 10000 mTorr, such as about 1000 mTorr. In some embodiments, a number of repeating pulses of the first precursor and second precursor may be made until the desired morphology is reached. The number of repeating pulses used to achieve the morphology depicted in FIG. 2B may be between about 1 and 100, such as about 10. Other tunable parameters may be used to achieve a desired morphology of the upper layer 118.

The ALD process continues to deposit a thin film of the metal oxide, thereby forming the metal oxide crust 222. The metal oxide crust 222 may have a thickness between about 0.1 nm and about 20 nm, such as about 10 nm. The cross-link between the metal oxide crust 222 and the material of the upper layer 118, may be have a thickness between about 0.1 nm and 20 nm, such as about 10 nm. Other dimensions are contemplated. The sidewall thickness of the metal oxide crust 222 encroaches into the openings 122 to create openings 122'. The metal oxide crust 222 effectively reduces the width of the openings 122 from $W_1$ to $W_1'$ and correspondingly increases the effective width of the pattern from $W_2$ to $W_2'$. In some embodiments $W_1'$ may be between about 3 nm and about 48 nm, such as about 8 nm, and $W_2'$ may be between about 7 nm and about 52 nm, such as about 12 nm. Other dimensions are contemplated.

In some embodiments, the metal oxide crust 222 can be formed over the photoresist material of the upper layer 118 without a uniform cross-link. In other words, the metal crust may be disposed on the surfaces of the upper layer 118 without converting any of the upper layer 118 into a carbon-metal-oxide inorganic material. In yet other embodiments, portions of the upper layer 118 may be converted into a carbon-metal-oxide inorganic material in a non-uniform manner.

In some embodiments, the uniformity of the cross-link between the crust 222 and the upper layer 118 is a such that a gradient is formed between the crust 222 and the upper layer 118, where a gradient of concentration of a carbon-metal-oxide inorganic material is formed, where the concentration decreases the deeper into the surface of the upper layer 118. For example, an outer interface of the crust 222 and the cross-link may be at a depth of about 0.1 nm and 20 nm, such as about 10 nm. At the outer interface of the crust 222 and the cross-link, a concentration of the carbon-metal-oxide may be substantially close to 100%. An inner interface of the material of the upper layer 118 and the cross-link may be at a depth of about 0.1 nm and 20 nm, such as about 10 nm. At the inner interface of the upper layer 118 and the cross-link, a concentration of the carbon-metal-oxide may be substantially close to 0%. At a distance about halfway between the outer interface of the crust 222 and the cross-link 223 and the inner interface of the material of the upper layer 118 and the cross-link 223, a concentration of the carbon-metal-oxide may be close to 50%, with the remaining material substantially comprising the material of the upper layer 118.

In some embodiments, the uniformity of the cross-link between the crust 222 and the upper layer 118 is such that for the entire depth of the cross-link 223, a concentration of carbon-metal-oxide inorganic material is substantially constant from the interface of the cross-link 223 and crust 222 to the interface of the cross-link 223 and the upper layer 118.

FIG. 2C illustrates a morphology of the upper layer 118 into a mask layer 224 where a metal oxide crust 224B is formed by converting the surface regions of the upper layer 118 into a carbon-metal-oxide inorganic material while interior regions 224A of the upper layer 118 remain unconverted. The process of forming the metal oxide crust 224B is similar to the formation of the cross-link 223 described with respect to FIG. 2B. A thermal ALD process may be used to deposit a metal based composite material into a surface portion of the photoresist material of the upper layer 118, thereby forming a carbon-metal-oxide crust 224B of mask 224 from the photoresist material of the upper layer 118 and a remaining unconverted portion 224A of the upper layer 118.

Similar to the process described above with respect to FIG. 2A, in the thermal ALD process, a metal precursor reacts with the carbon oxygen (C═O) bonds in the organic photoresist material to produce bonds including the metal oxide, resulting in a carbon-metal-oxide inorganic material. In the embodiment of FIG. 2C, however, the carbon-metal-oxide inorganic material forms at the surface of the upper layer 118 to create crust 224B. The ALD process uses alternating precursors to achieve a thin film deposition. As shown in FIG. 2C, the thin film deposition penetrates surfaces of the upper layer 118 to convert the surface to a carbon-metal-oxide inorganic material. The carbon-metal-oxide crust 224B may have a thickness between about 0.1 nm and about 20 nm, such as about 10 nm. Other thicknesses are contemplated and may vary based on the process environment.

The process temperature may be between below 250° C., to encourage molecular debonding and rebonding of the materials and conversion of the upper layer 118 to mask 224. In some embodiments, the temperature should be kept low enough to (e.g., lower than about 200° C.) to avoid decomposition of the material of upper layer 118. The process temperature may be tunable to achieve a desired morphology of the upper layer 118.

The process flow rate of the first precursor may be between about 100 sccm and about 3000 sccm, such as about 500 sccm. The process flow rate may be tunable to achieve a desired morphology of the upper layer 118. The process flow rate of the second precursor may be between about 100 sccm and about 3000 sccm, such as about 500 sccm. The process flow rate of the second precursor may also be tunable, similar to the process flow rate of the first precursor.

The feed time of the first precursor may be between about 0.05 s and 10 s, such as about 1 s. The feed time of the second precursor may be between about 0.05 s and 10 s, such as about 1 s. The pressure for the process may be held to be between about 100 mTorr and about 10000 mTorr, such as about 1000 mTorr. In some embodiments, a number of repeating pulses of the first precursor and second precursor may be made until the desired morphology is reached. The number of repeating pulses used to achieve the morphology depicted in FIG. 2C may be between about 1 and 100, such as about 10. Other tunable parameters may be used to achieve a desired morphology of the upper layer 118.

The ALD process can be performed using processes and materials similar to those described with respect to FIG. 2A, which are not repeated. The different resulting morphology of the upper layer 118 to produce the morphology illustrated in FIG. 2C may result from differences in the photoresist material used, the precursors selected, the tunable process conditions discussed above, and other local factors, such as the pattern at a particular portion of the upper layer 118 or variances in process conditions in the process chamber.

In some embodiments, the carbon-metal-oxide crust 224B has a gradient of concentration of carbon-metal-oxide where the concentration decreases the deeper into the surface of the mask 224. For example, at the surface of the carbon-metal-oxide crust 224B, a concentration of the carbon-metal-oxide may be substantially close to 100%. At an interface of the carbon-metal-oxide crust 224B and unconverted portion 224A of the mask 224, a concentration of the carbon-metal-oxide may be substantially close to 0% at a depth of about 10 nm and about 40 nm, such as about 20 nm. At a distance about halfway between the surface of carbon-metal-oxide crust 224B and the interface of the carbon-metal-oxide crust 224B and unconverted portion 224A, a concentration of the carbon-metal-oxide may be close to 50%, with the remaining material substantially comprising the material of the upper layer 118.

After conversion of the upper layer 118, process embodiments may produce species of mask 220 as discussed with respect to FIG. 2A, the upper layer 118 with crust 222 as discussed with respect to FIG. 2B, mask 224 as discussed with respect to FIG. 2C, or combinations thereof. Embodiments use the metal based composite material to modify the composition of the photoresist material of the upper layer 118 to shrink the critical dimension (CD) of the semiconductor device 100 and/or to enhance etch selectivity between the modified upper layer 118 (see FIGS. 2A-2C) and the middle layer 116.

Figure 3A:
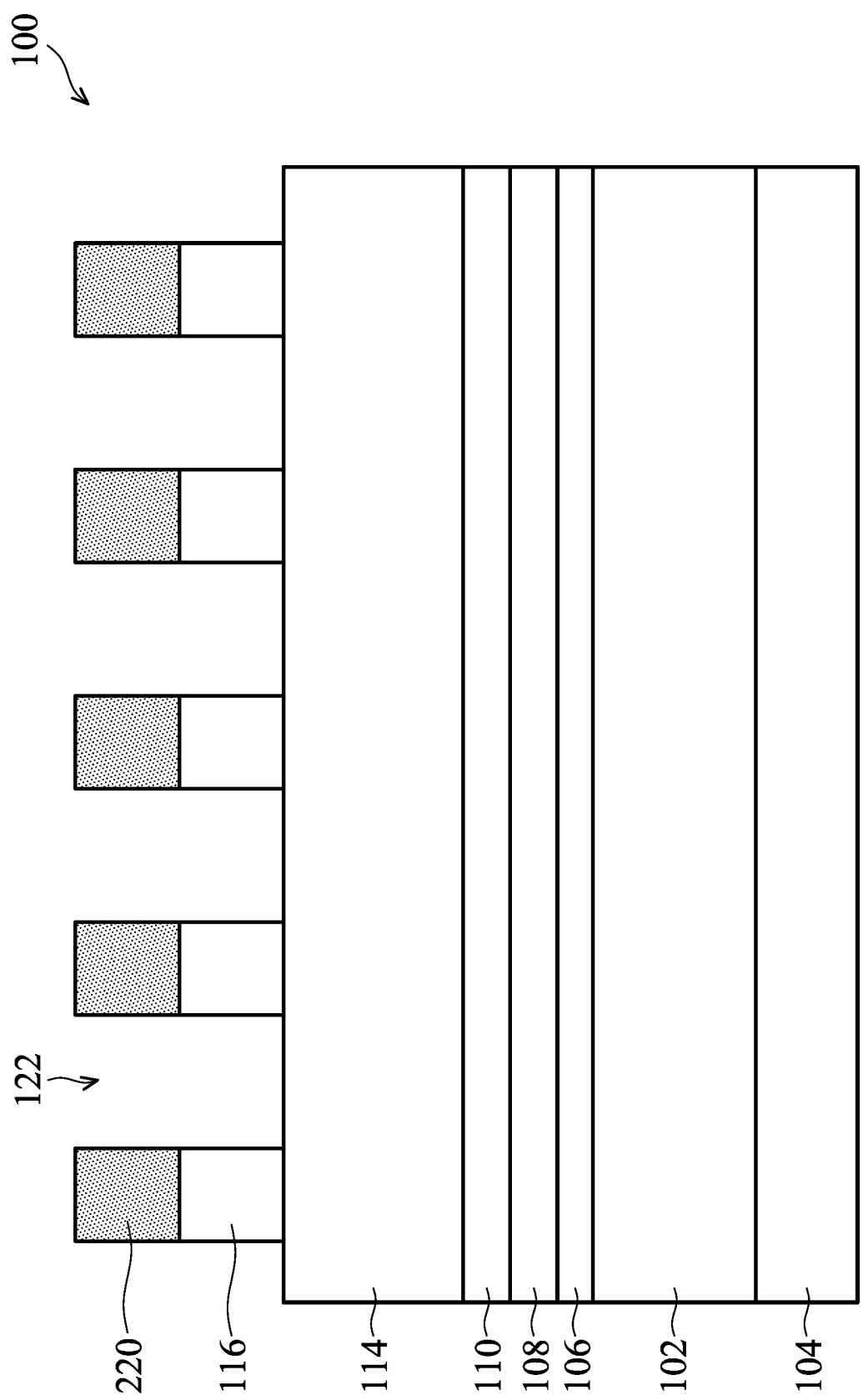
Figure 3B:
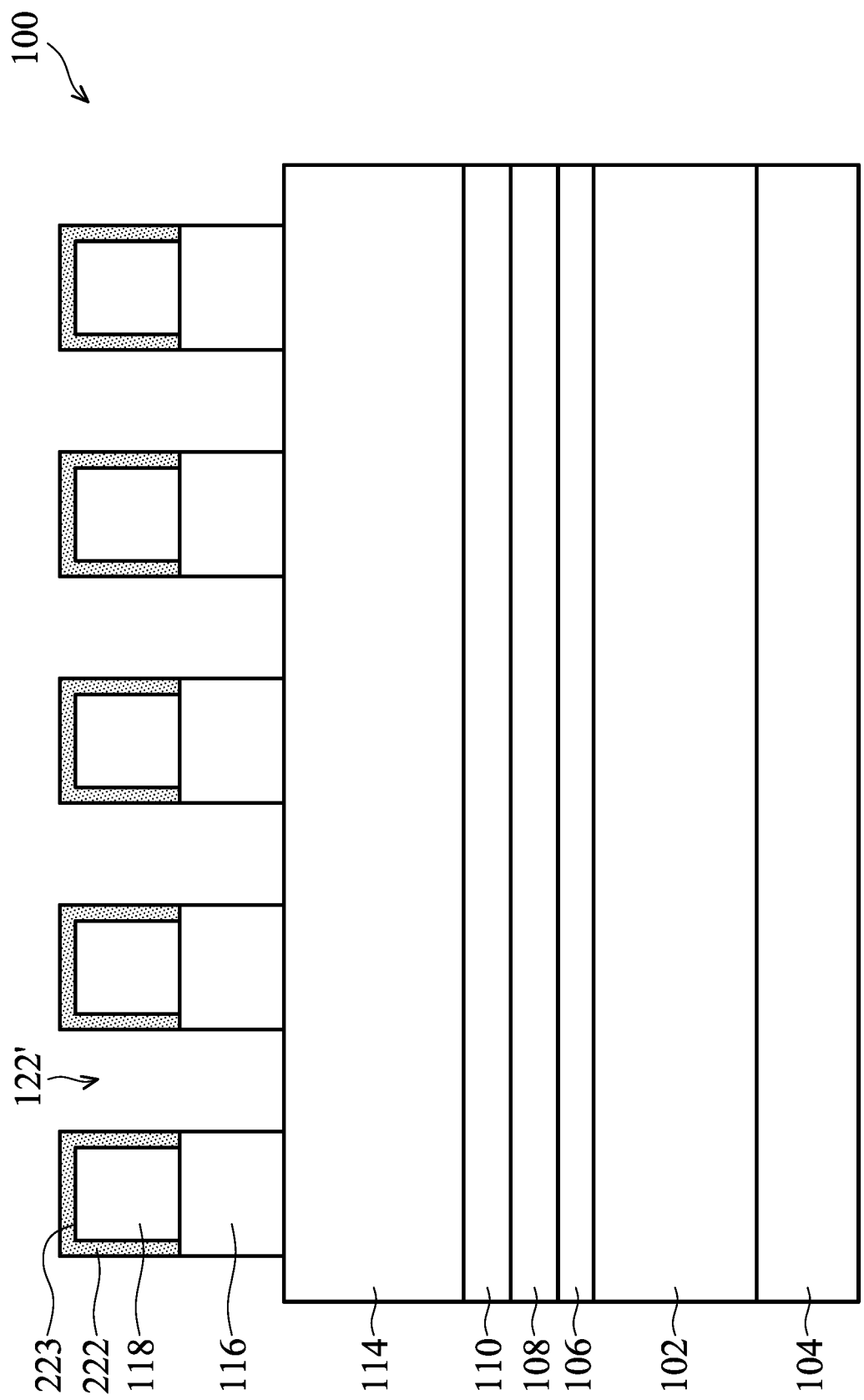
Figure 3C:
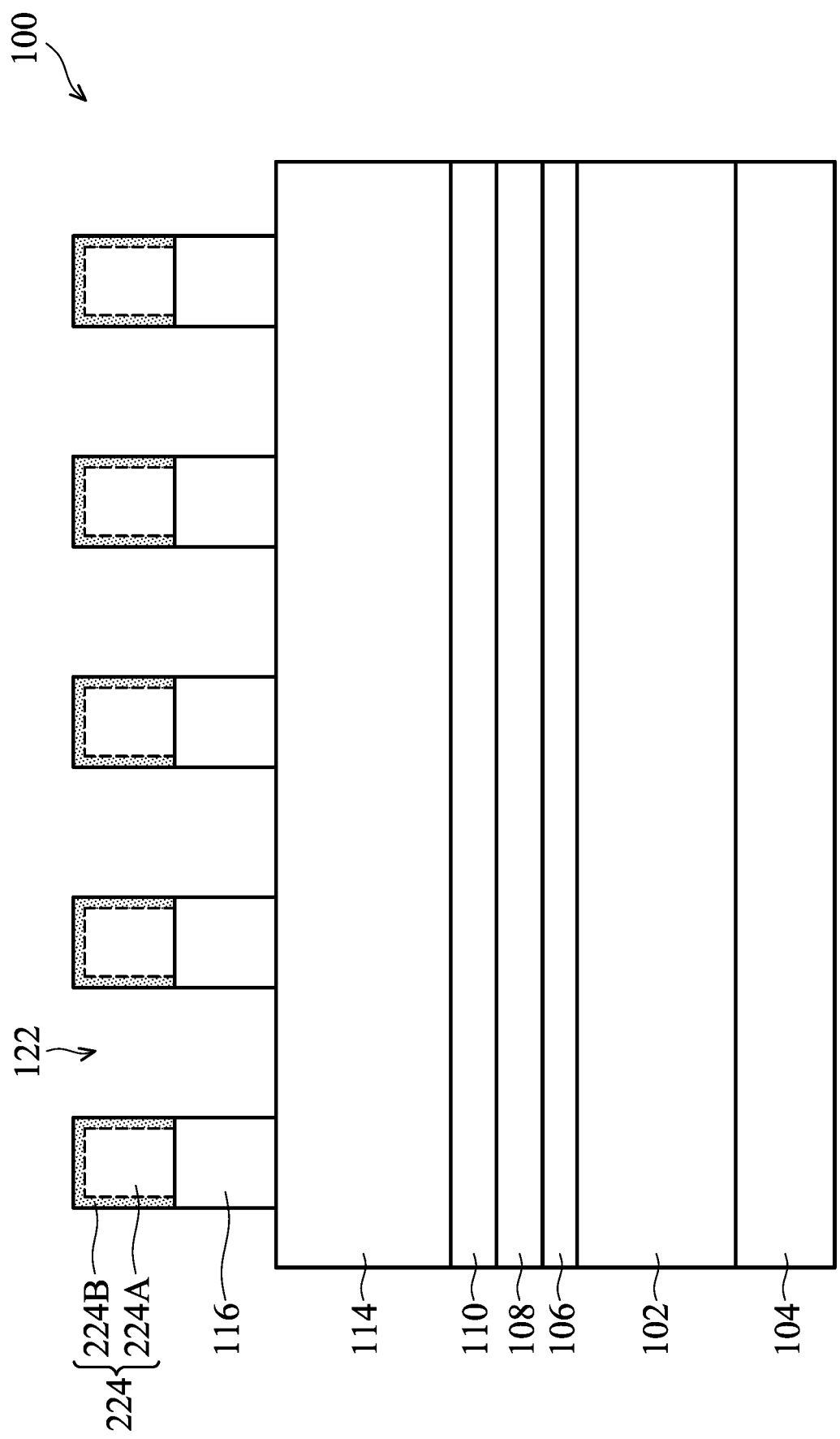

After the patterning of the upper layer 118 and conversion of the upper layer 118 adding a metal composite material to the upper layer 118, FIGS. 3A, 3B, and 3C illustrate the transferring of the pattern of the upper layer 118 after conversion to the middle layer 116 in an etching process.

FIG. 3A illustrates transferring the pattern of the mask 220 to the middle layer 116. FIG. 3B illustrates transferring the pattern of the metal oxide crust 222 to the middle layer 116. FIG. 3C illustrates transferring the pattern of the mask 224 to the middle layer 116. The etching process is anisotropic, so that the openings 122 (or openings 122' for embodiments consistent with FIG. 3B) are extended through the middle layer 116 and have about the same sizes in the middle layer 116 as they do in the overlying layer—mask 220, metal oxide crust 222, mask 224, or combinations thereof.

Figure 4B:
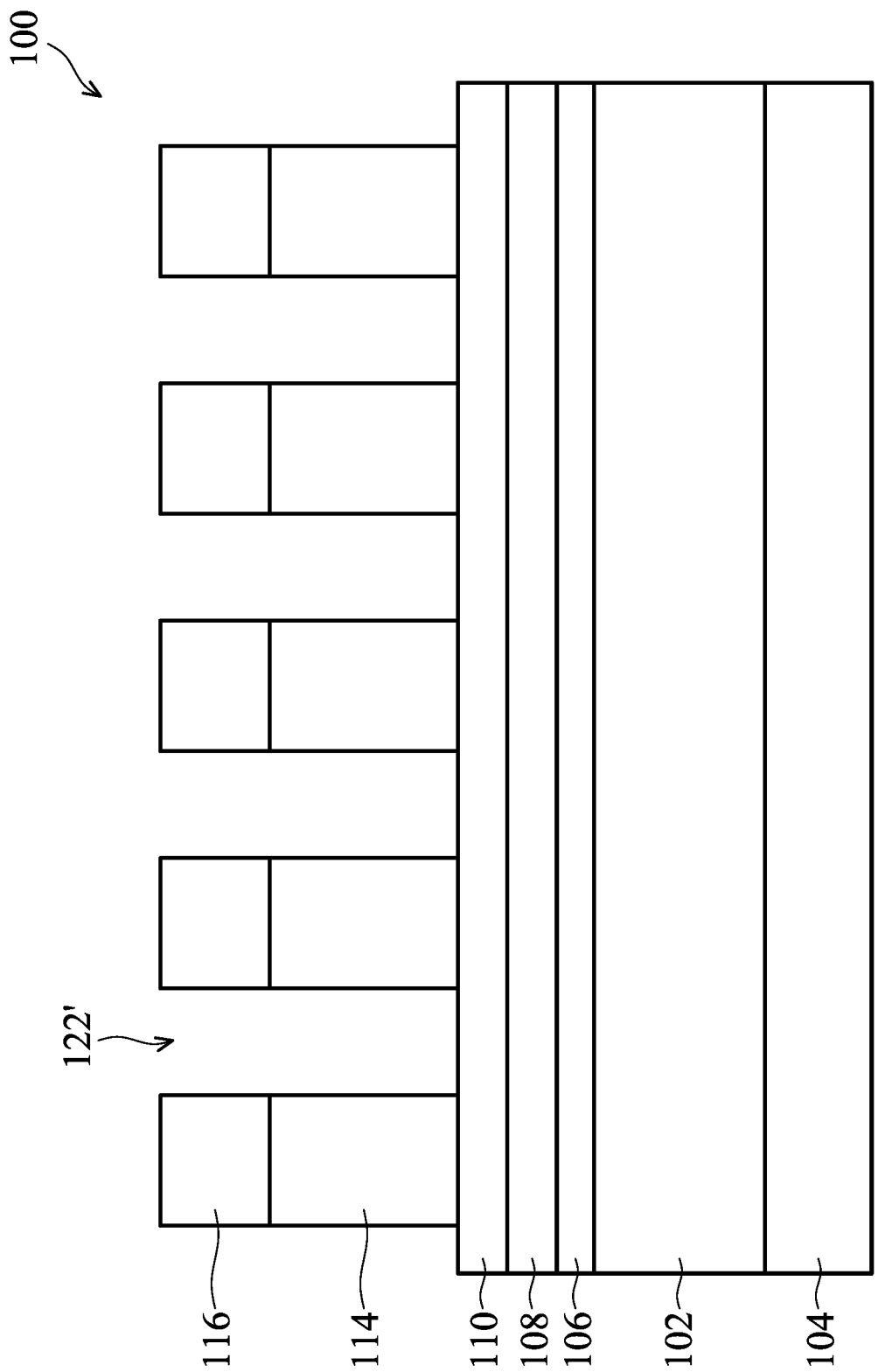
Figure 4C:
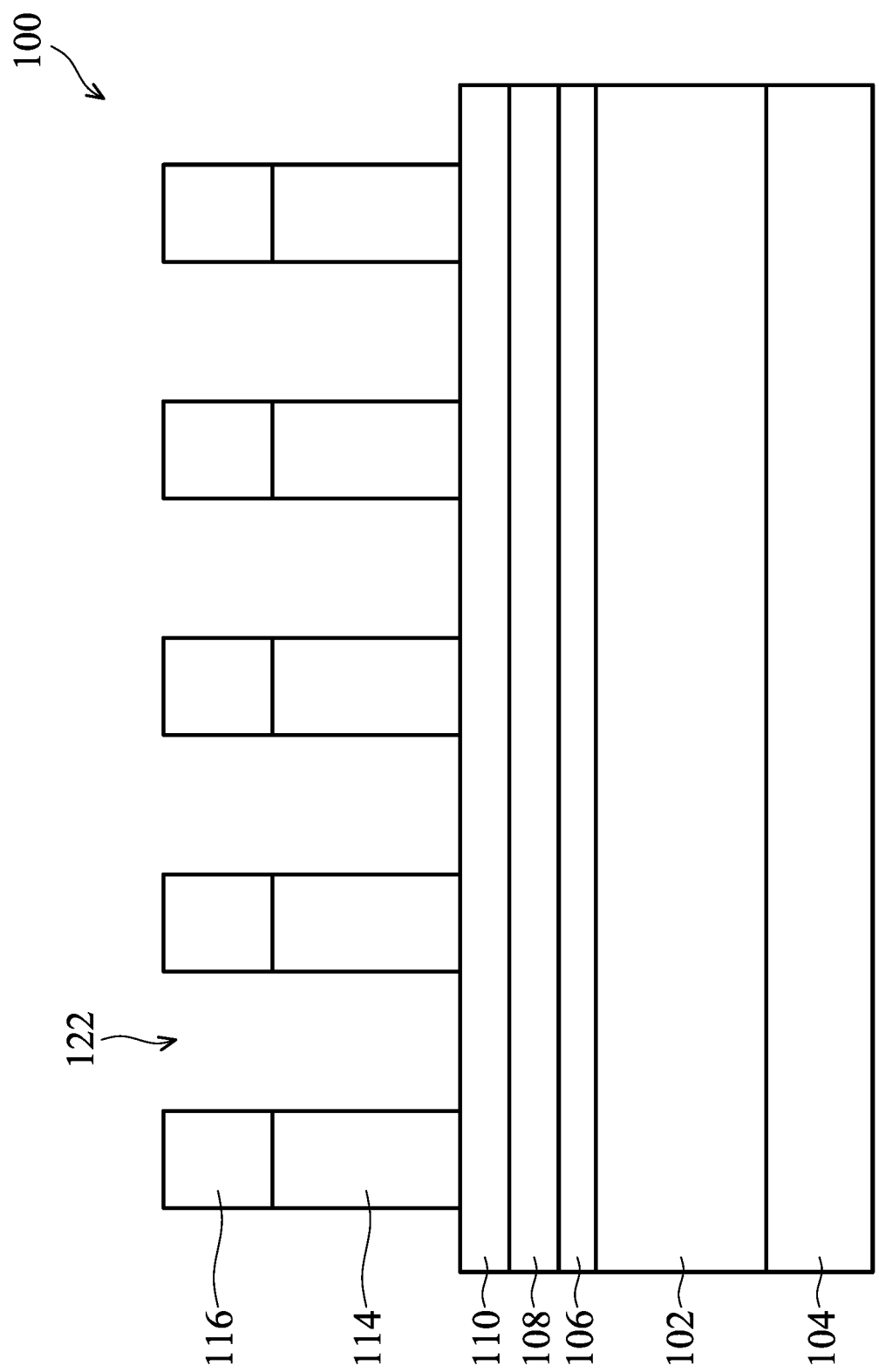

In FIGS. 4A, 4B, and 4C an etching process is performed to transfer the pattern of the middle layer 116 to the bottom layer 114, thereby extending the openings 122 (or openings 122' for embodiments consistent with FIG. 4B) through the bottom layer 114. The etching process of the bottom layer 114 is anisotropic, so that the openings 122 (or 122') in the middle layer 116 are extended through the bottom layer 114 and have about the same sizes in the bottom layer 114 as they do in the middle layer 116. As part of etching the bottom layer 114, the mask 220, carbon-metal-oxide crust 222 and upper layer 118, or the mask 224 (see FIGS. 2A-2C) may be consumed. In some embodiments, the mask 220, carbon-metal-oxide crust 222 and upper layer 118, or the mask 224 may be removed by a separate process prior to or after the etching of the bottom layer 114.

Figure 5:
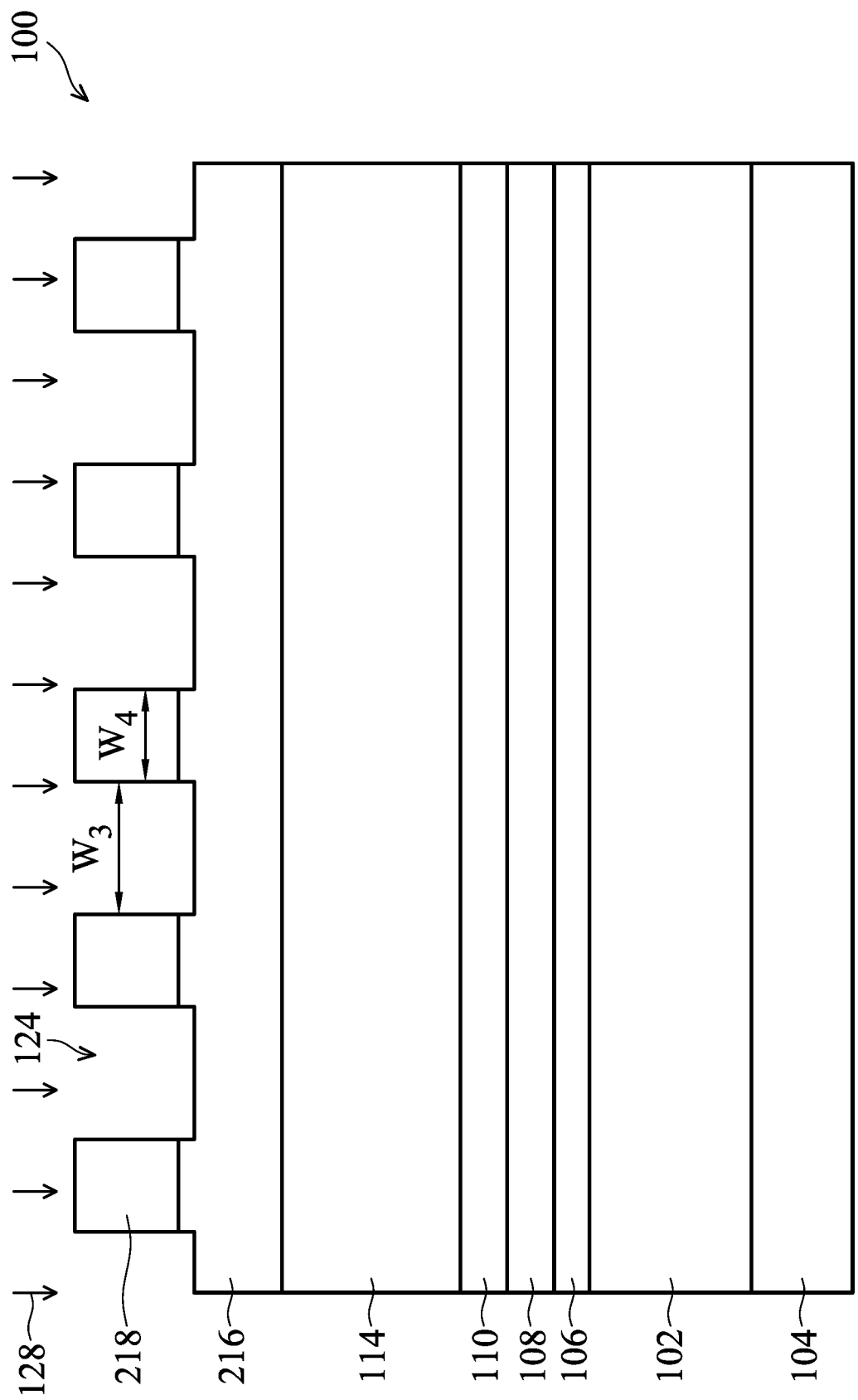
FIGS. 5, 6A, 6B, 6C, 7A, 7B, 7C, 8A, 8B, and 8C illustrate cross-sectional views of various intermediary stages of manufacturing a semiconductor device in accordance with other embodiments.

Referring to FIG. 5, FIG. 5 illustrates an optional de-scum process 128 on the semiconductor device 100 after the patterning of the upper layer 118 as illustrated in FIG. 1. The de-scum process 128 uniformly removes a small amount of material from the exposed parts of the upper layer 118 and middle layer 116 to produce a modified upper layer 218 and modified middle layer 216. The de-scum process 128 provides vertical resist profiles of the upper layer 118 and removes residue of the upper layer 118 which remain in openings 122 after patterning. The de-scum process may use a wet or dry etch process to facilitate the removal of material of the upper layer 118 and middle layer 116. Suitable chemical etchants for a wet de-scum process include tetramethylammonium hydroxide (TMAH), sulfuric acid ($H_2SO_4$), potassium hydroxide (KOH), boron hydroxide (BOH), other suitable acids or hydroxides, or combinations thereof. Suitable process gasses for a dry de-scum process include oxygen, a fluorine containing gas, a chlorine containing gas, an $O_2$ based gas, or combinations thereof. The de-scum process 128 may comprise one or more process steps.

As a result of the de-scum process 128, openings 122 are enlarged into openings 124. The width $W_3$ of the openings 124 may be between about 6 nm and about 51 nm, such as about 11 nm. Correspondingly, the width $W_4$ of portions of the pattern 218 at its narrowest points may be between about 4 nm and about 49 nm, such as about 9 nm. The openings 124 may extend into the middle layer 216 by about 1 nm to about 10 nm, such as about 5 nm.

Figure 6A:
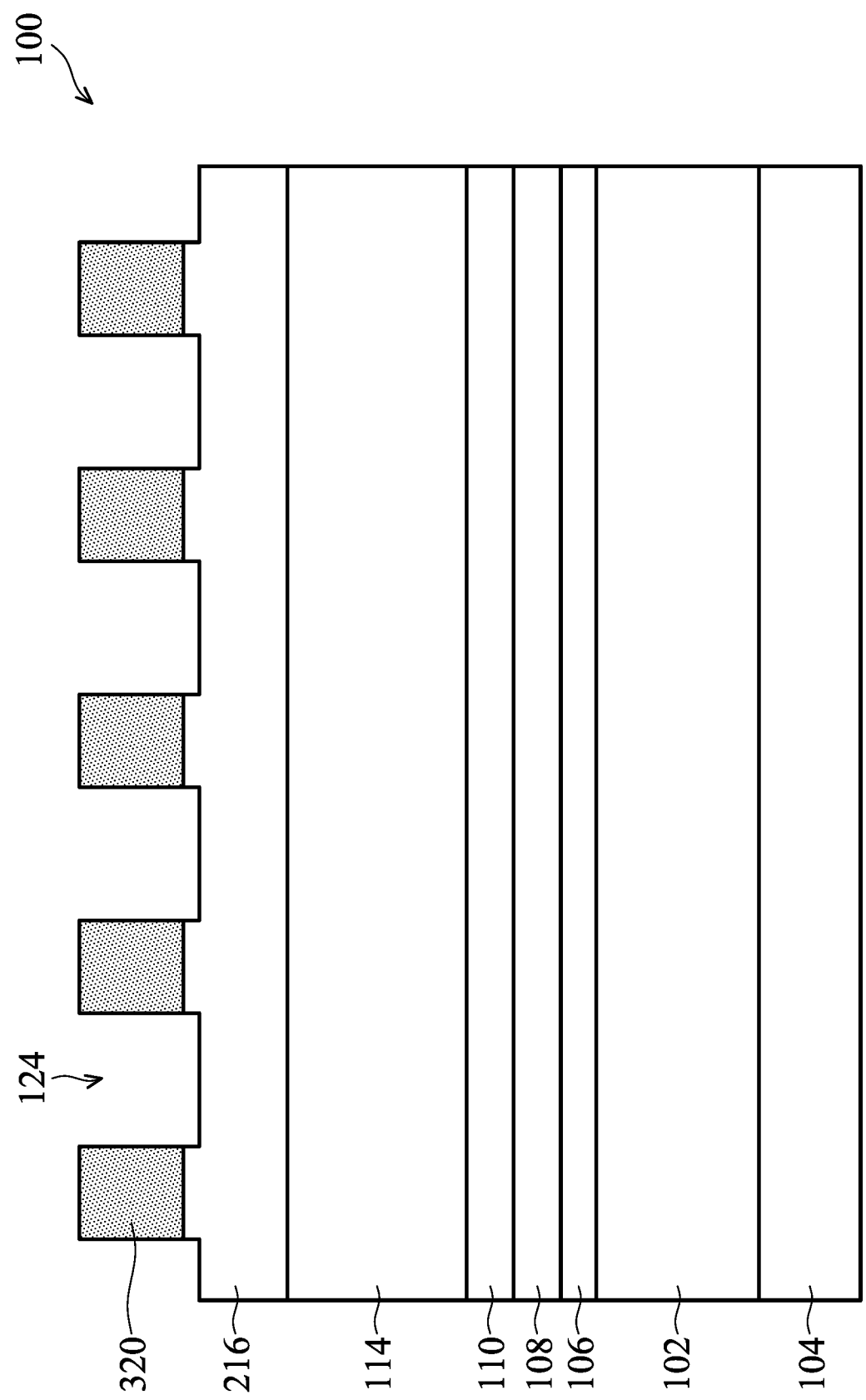
Figure 6B:
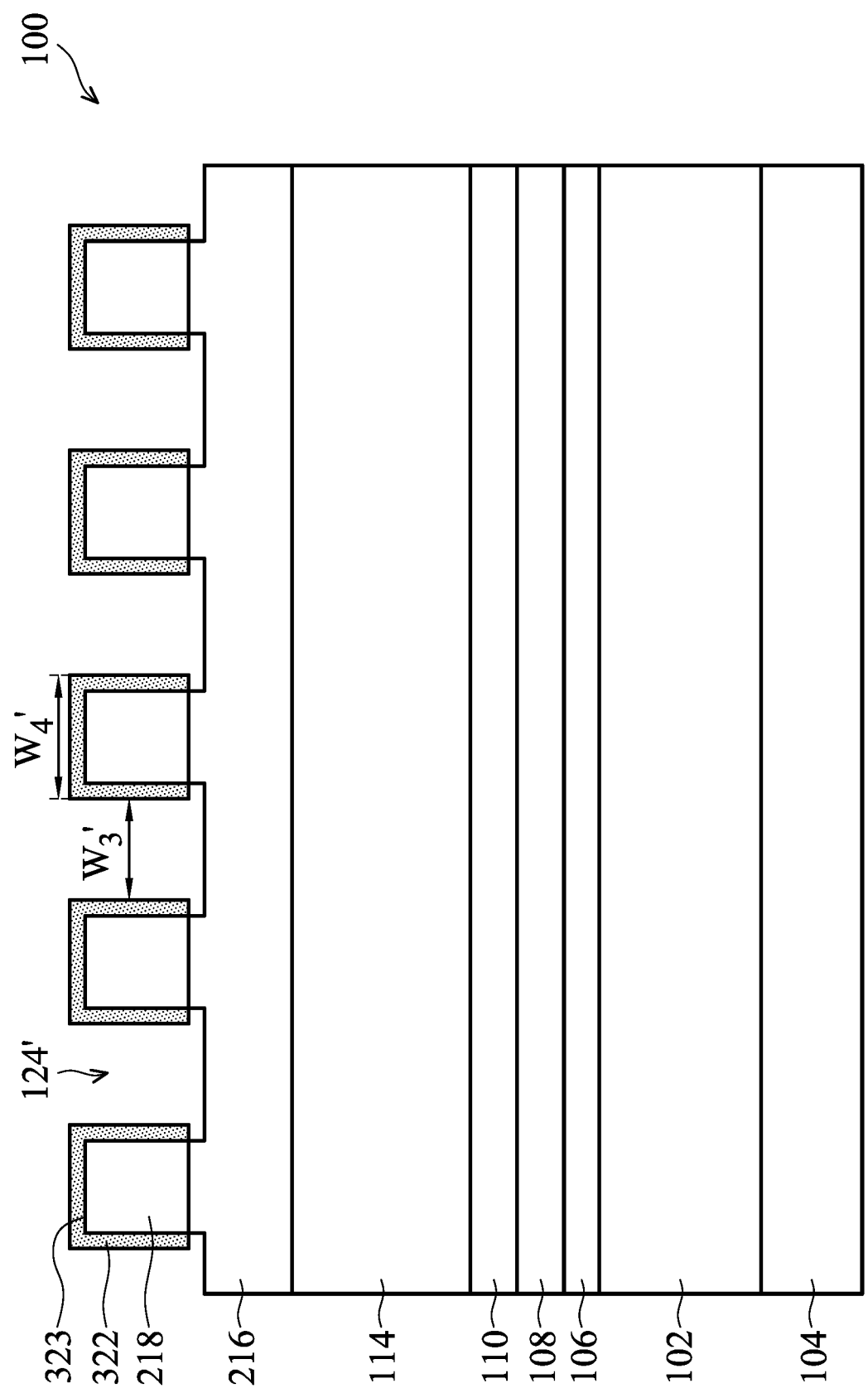
Figure 6C:
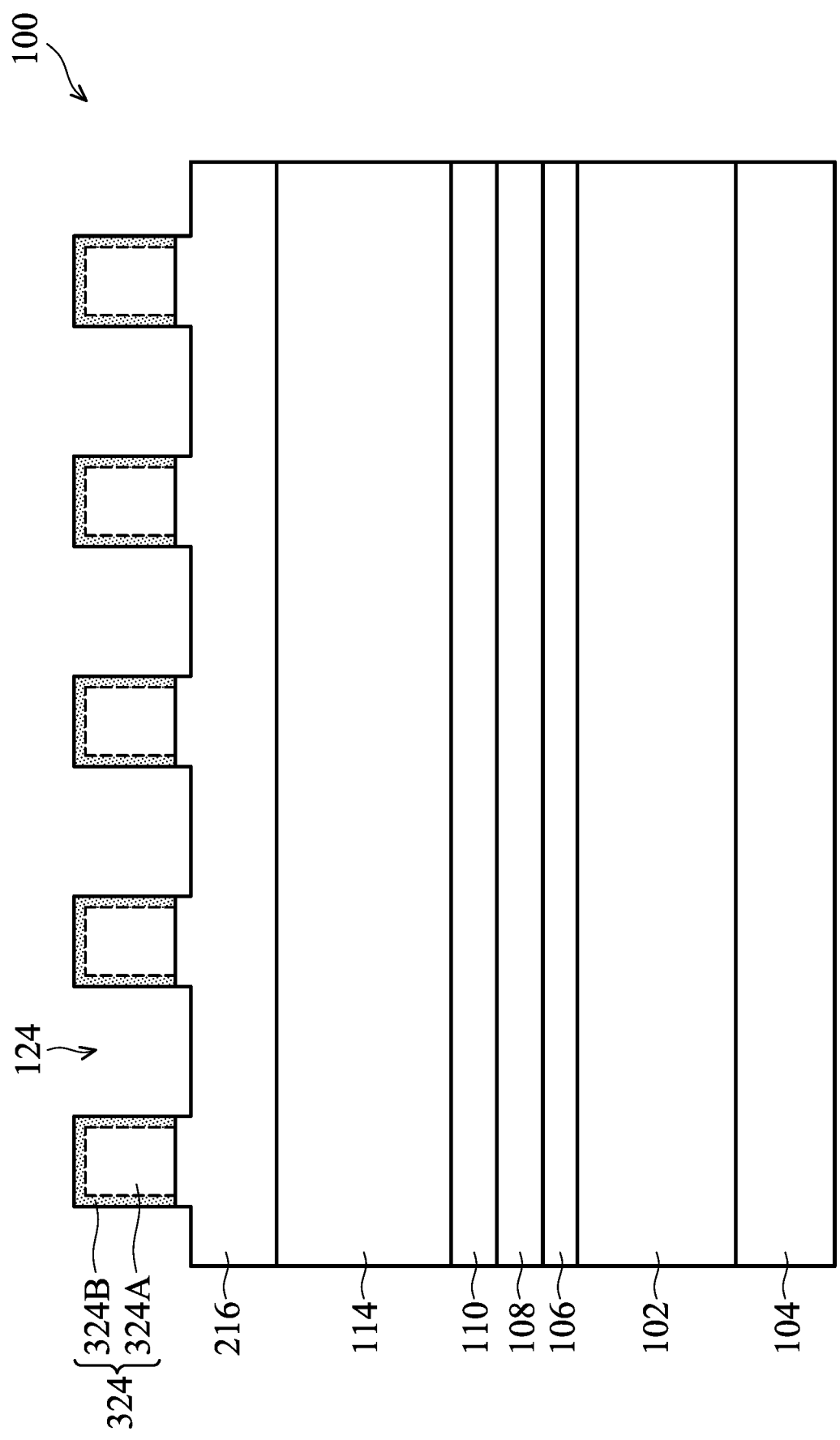

FIGS. 6A, 6B, and 6C illustrate three different morphologies of the upper layer 118 after the de-scum process in accordance with process embodiments. FIG. 6A illustrates a morphology of the upper layer 218 where the upper layer 218 is converted to a mask layer 320 comprising a uniform morphology of a metal-oxide-photoresist material. FIG. 6B illustrates a morphology of the upper layer 218 where a metal oxide crust 322 is formed which has a uniform cross-link to the photoresist material of the upper layer 218. FIG. 6C illustrates a morphology of the upper layer 218 where the upper layer 218 is converted to a mask layer 324 having an outer layer 324B which is converted from the upper layer 218 to a metal-oxide-photoresist material and an inner layer 324A which is an unconverted portion of the upper layer 218.

In FIG. 6A, a thermal ALD process may be used to deposit a metal based composite material into the photoresist material of the upper layer 218, thereby converting the upper layer 218 into a mask layer 320. The upper layer 218 may be converted into the mask layer 320 using processes and materials similar to those described above with respect to FIG. 2A.

FIG. 6B illustrates a morphology of the upper layer 218 where a metal oxide crust 322 is formed which has a uniform cross-link 323 to the photoresist material of the upper layer 218. A thermal ALD process may be used to deposit a metal based composite material into a surface portion of the photoresist material of the upper layer 218, thereby forming a uniform cross-link 323 from the photoresist material of the upper layer 218 to the metal oxide crust 322. The metal oxide crust 322 and cross-link 323 may be formed using processes and materials similar to those described above with respect to FIG. 2B. The sidewall thickness of the metal oxide crust 322 encroaches into the openings 124 to create openings 124'. The metal oxide crust 322 effectively reduces the width of the openings 122 from $W_3$ (see FIG. 5) to $W_3'$ and correspondingly increases the effective width of the pattern from $W_4$ (see FIG. 5) to $W_4'$. In some embodiments $W_3'$ may be between about 4 nm and about 49 nm, such as about 9 nm, and $W_4'$ may be between about 6 nm and about 51 nm, such as about 11 nm. Other dimensions are contemplated.

In some embodiments, the metal oxide crust 322 can be formed over the photoresist material of the upper layer 218 without a uniform cross-link. In other words, the metal oxide crust 322 may be disposed on the surfaces of the upper layer 218 without converting any of the upper layer 218 into a carbon-metal-oxide inorganic material. In yet other embodiments, portions of the upper layer 218 may be converted into a carbon-metal-oxide inorganic material in a non-uniform manner.

FIG. 6C illustrates a morphology of the upper layer 218 into a mask layer 324 where a metal oxide crust 324B is formed by converting the surface regions of the upper layer 218 into a carbon-metal-oxide inorganic material while interior regions 324A of the upper layer 218 remain unconverted. A thermal ALD process may be used to deposit a metal based composite material into a surface portion of the photoresist material of the upper layer 218, thereby forming a carbon-metal-oxide crust 324B of mask 324 from the photoresist material of the upper layer 218 and a remaining unconverted portion 324A of the upper layer 218. The carbon-metal-oxide crust 324B may be formed using processes and materials similar to those described above with respect to FIG. 2C.

After conversion of the upper layer 218, process embodiments may produce species of mask 320 as discussed with respect to FIG. 6A, the upper layer 218 with crust 322 as discussed with respect to FIG. 6B, mask 324 as discussed with respect to FIG. 6C, or combinations thereof. Embodiments use the metal based composite material to modify the composition of the photoresist material of the upper layer 218 to shrink the critical dimension (CD) of the semiconductor device 100 and to enhance etch selectivity between the modified upper layer 218 (see FIGS. 6A-6C) and the middle layer 216.

Figure 7A:
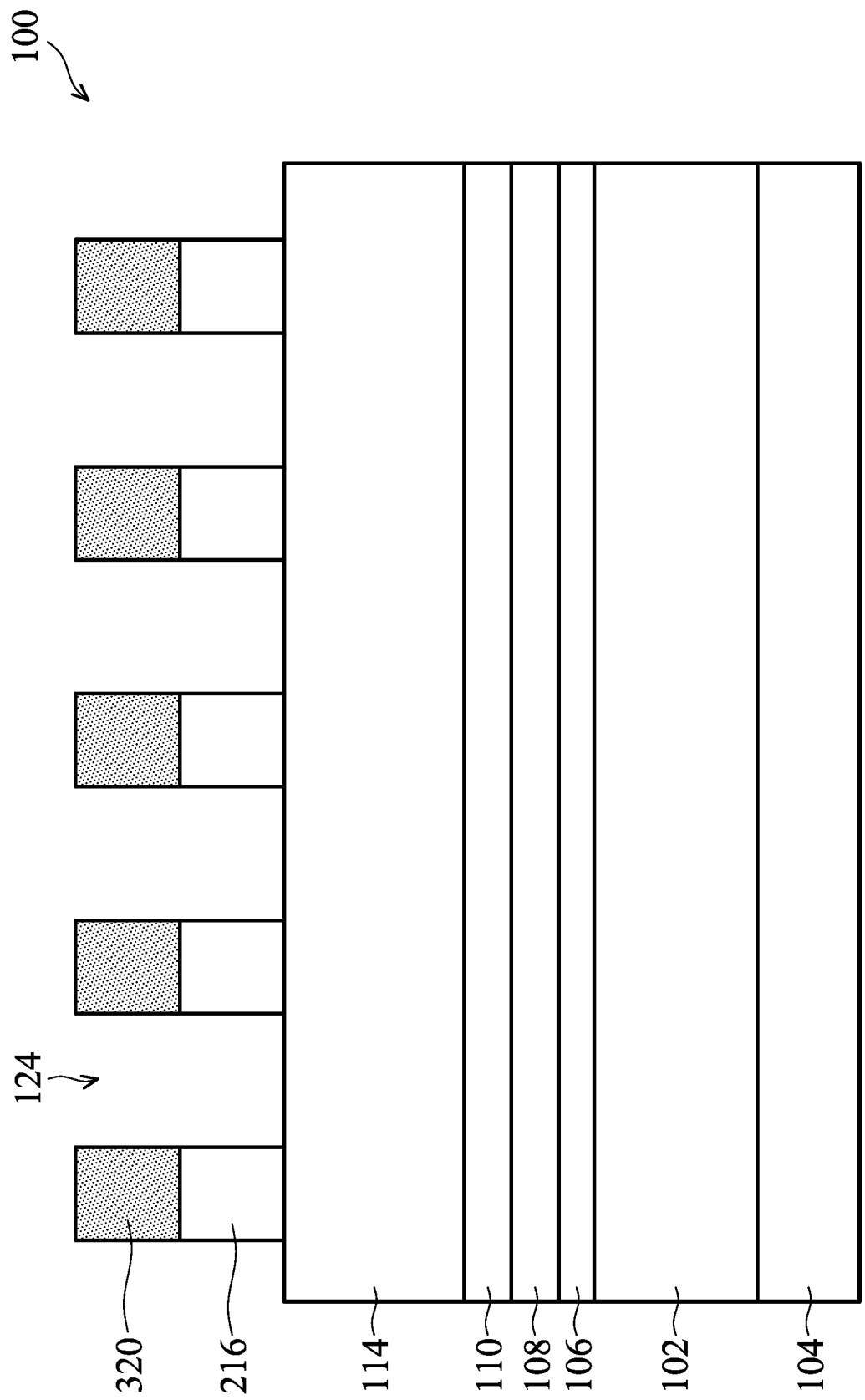
Figure 7B:
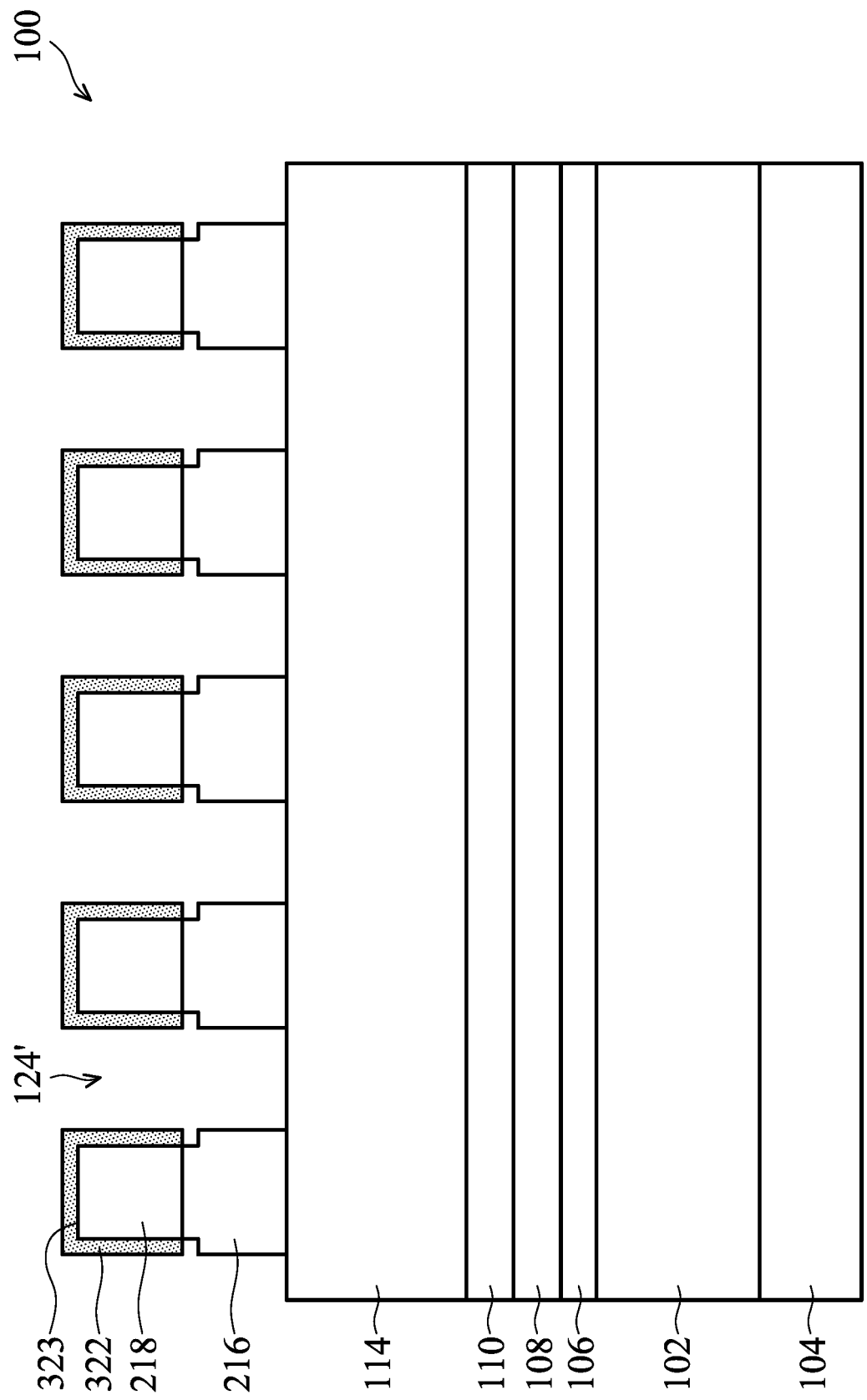
Figure 7C:
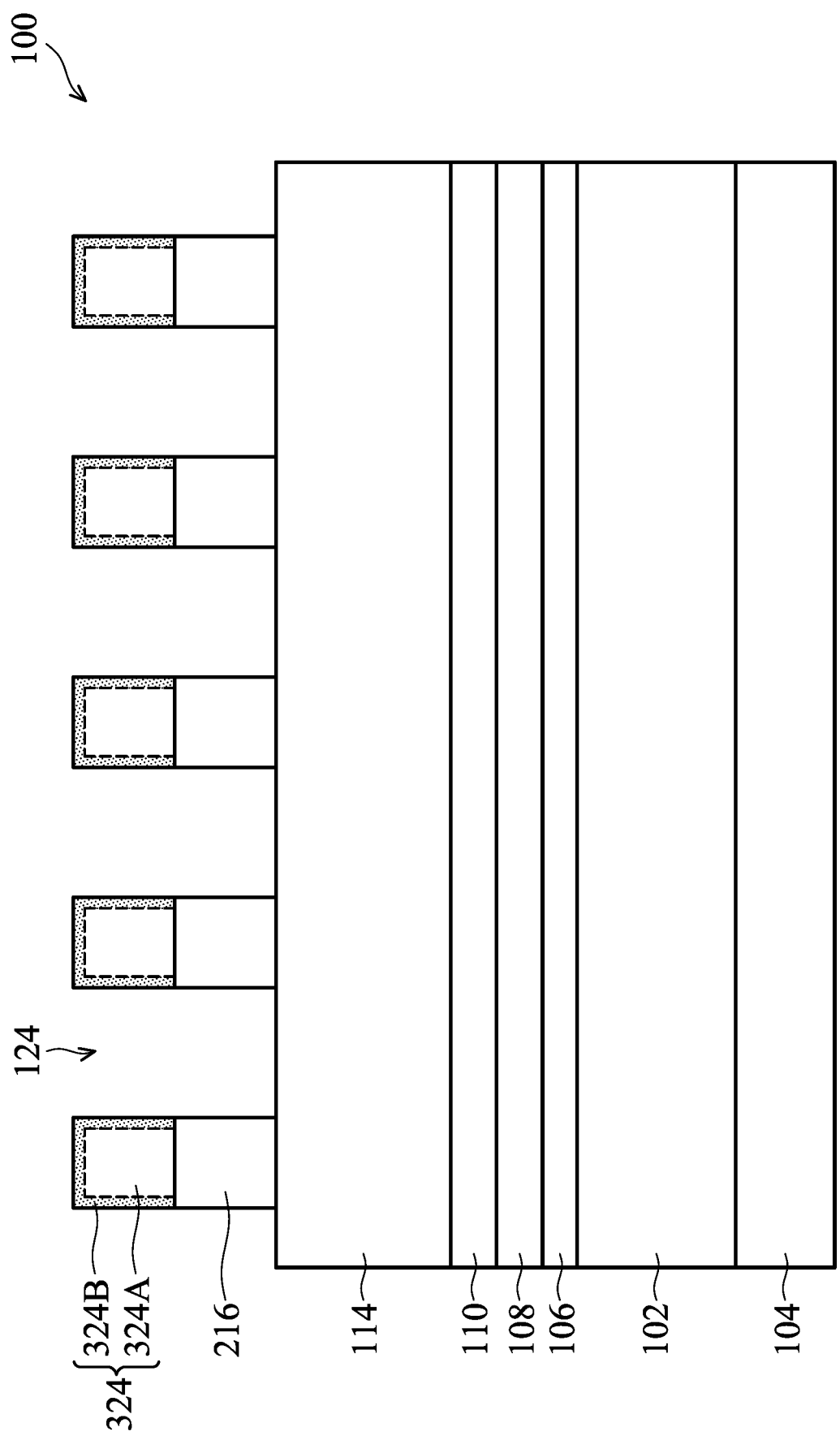

After the patterning of the upper layer 118, the de-scum process 128, and conversion of the upper layer 218 adding a metal composite material to the upper layer 218, FIGS. 7A, 7B, and 7C illustrate the transferring of the pattern of the upper layer 218 after conversion to the middle layer 216 in an etching process.

FIG. 7A illustrates transferring the pattern of the mask 320 to the middle layer 216. FIG. 7B illustrates transferring the pattern of the metal oxide crust 322 to the middle layer 216. FIG. 7C illustrates transferring the pattern of the mask 324 to the middle layer 216. The etching process is anisotropic, so that the openings 124 (or openings 124' for embodiments consistent with FIG. 6B) are extended through the middle layer 216 and have about the same sizes in the middle layer 216 as they do in the overlying layer—mask 320, metal oxide crust 322, mask 324, or combinations thereof.

Figure 8A:
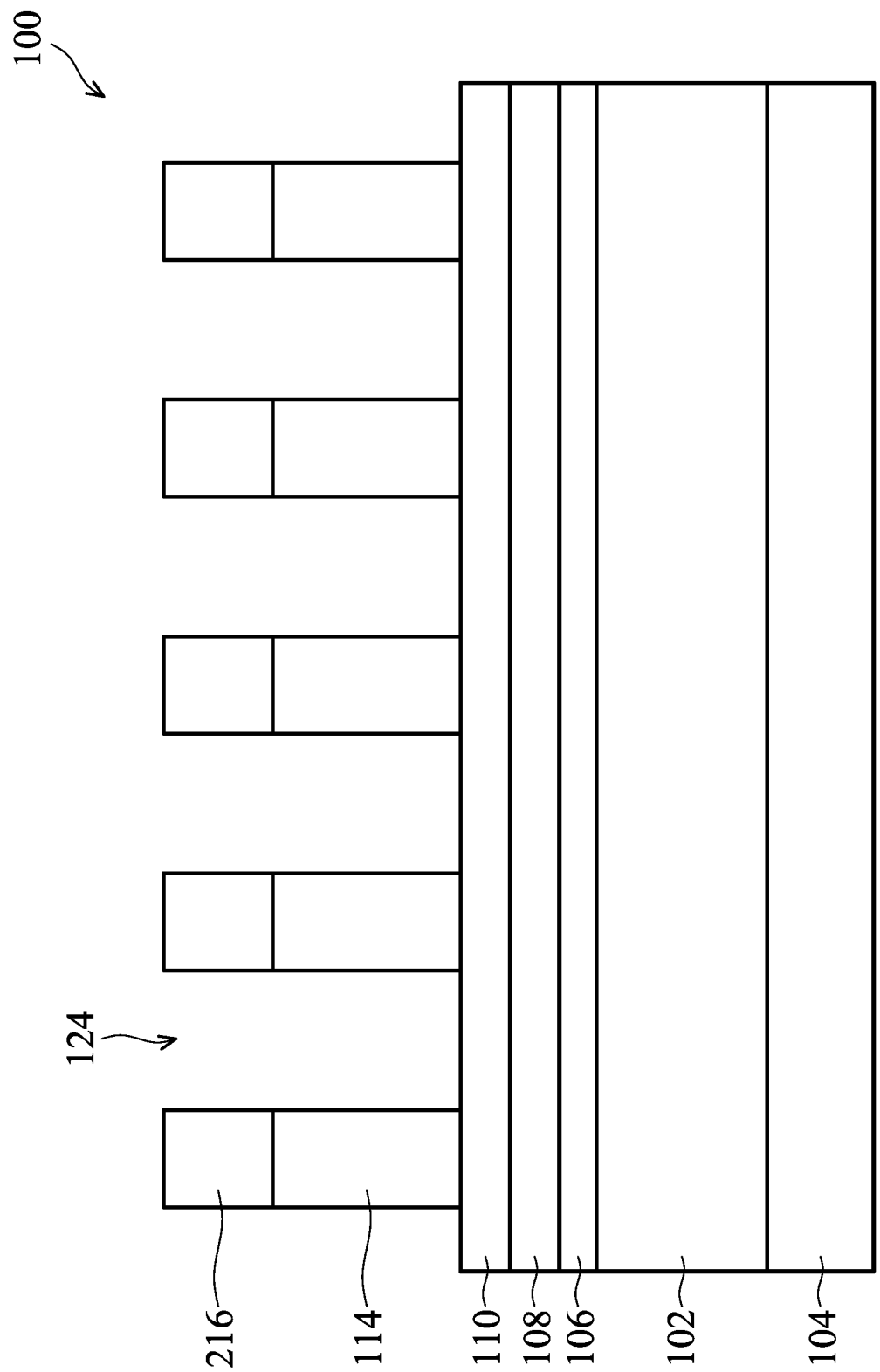
Figure 8B:
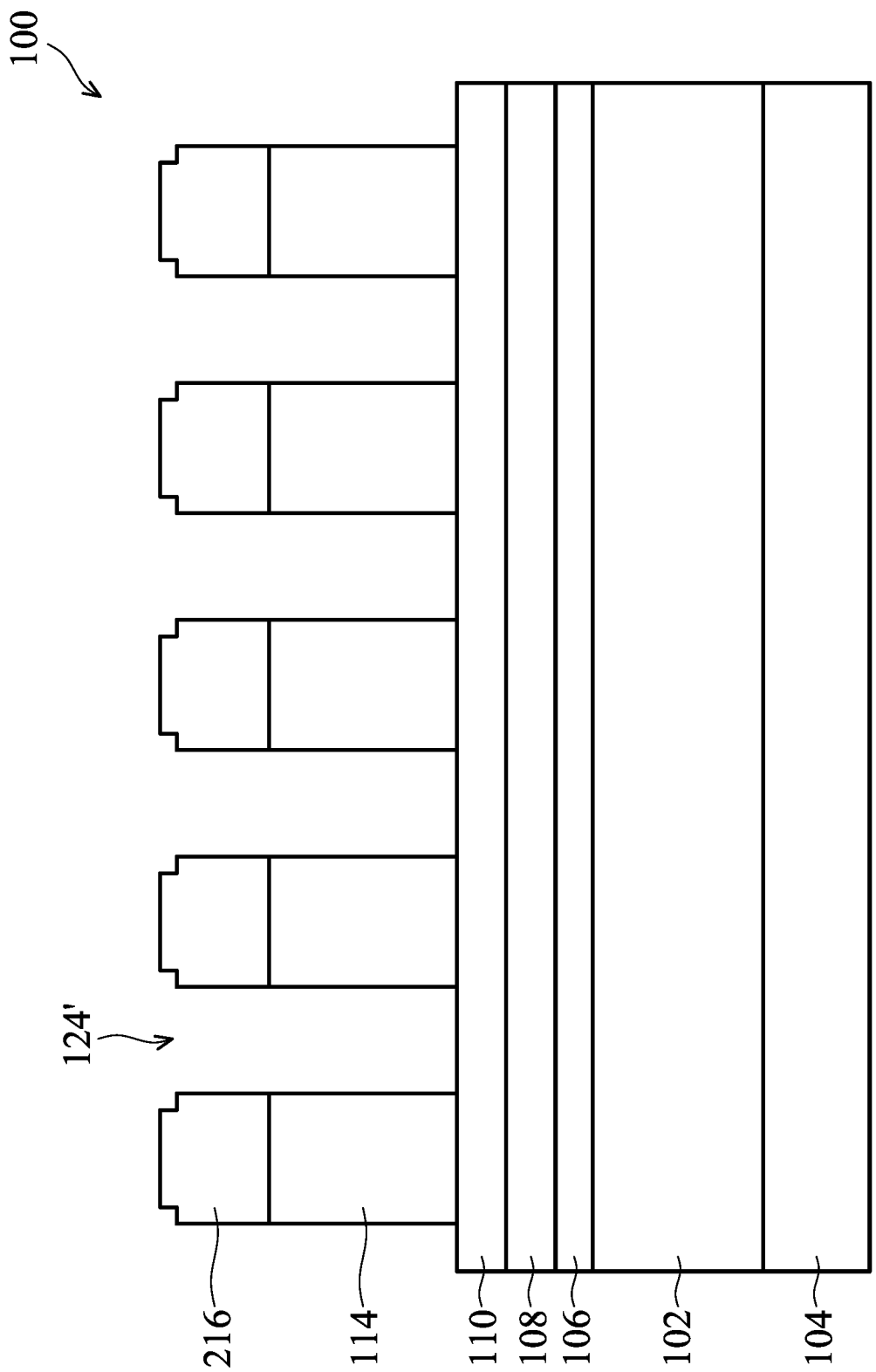
Figure 8C:
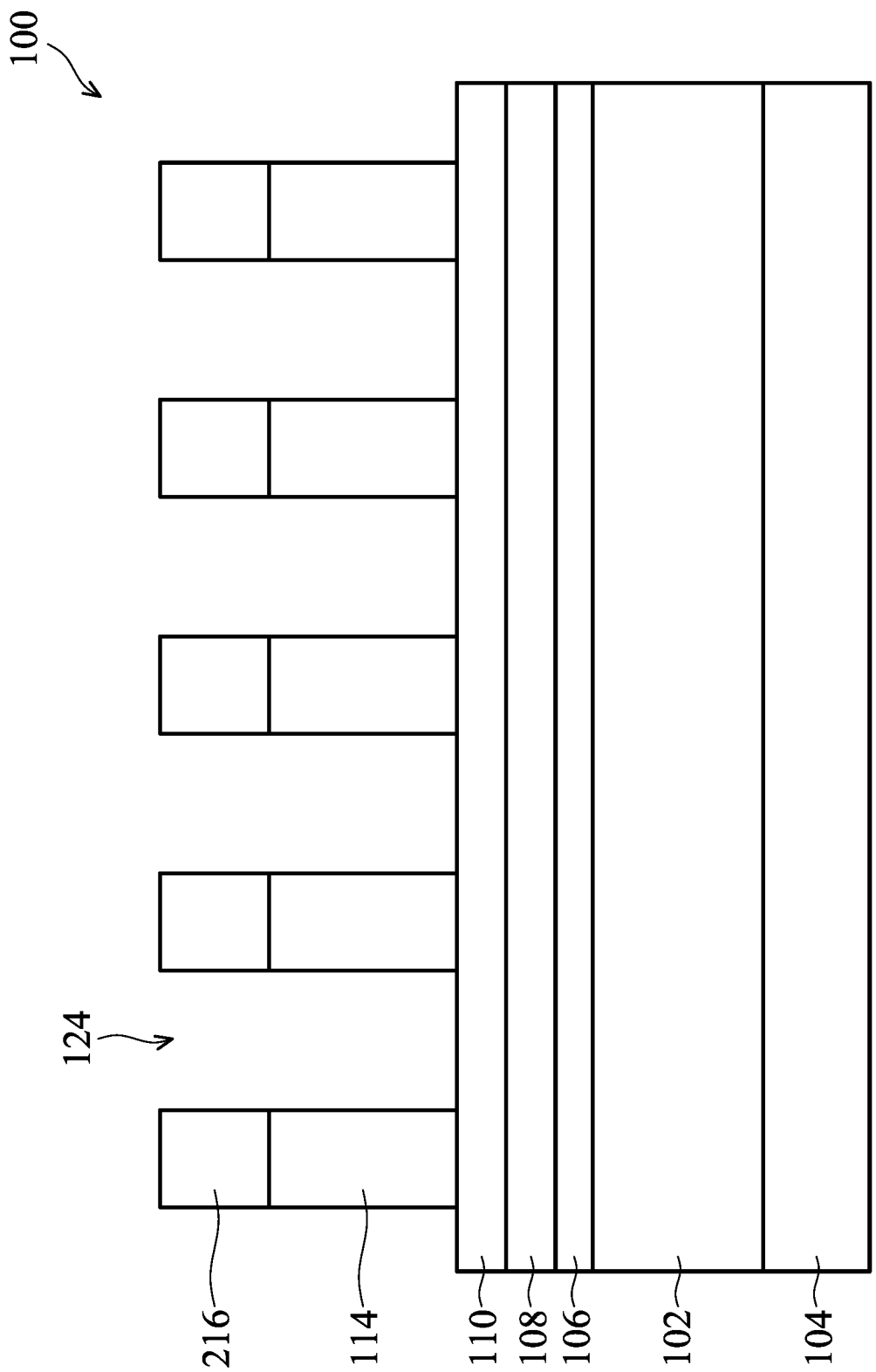

In FIGS. 8A, 8B, and 8C an etching process is performed to transfer the pattern of the middle layer 216 to the bottom layer 114, thereby extending the openings 124 (or openings 124' for embodiments consistent with FIG. 8B) through the bottom layer 114. The etching process of the bottom layer 114 is anisotropic, so that the openings 124 (or 124') in the middle layer 216 are extended through the bottom layer 114 and have about the same sizes in the bottom layer 114 as they do in the middle layer 216. As part of etching the bottom layer 114, the mask 320, carbon-metal-oxide crust 322 and upper layer 218, or the mask 324 (see FIGS. 6A-6C) may be consumed. In some embodiments, the mask 320, carbon-metal-oxide crust 322 and upper layer 218, or the mask 324 may be removed by a separate process prior to or after the etching of the bottom layer 114.

Figure 9:
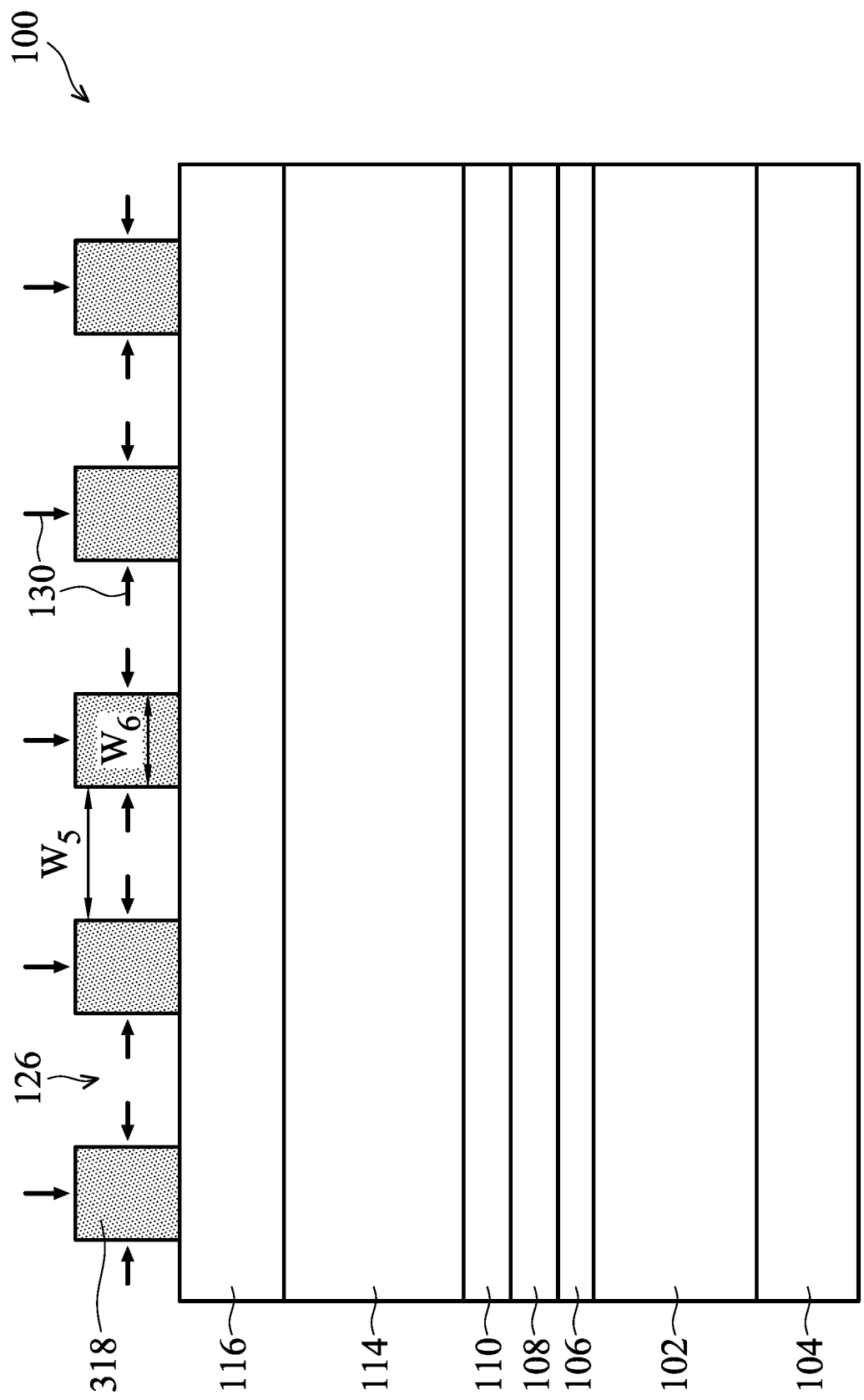
FIGS. 9, 10A, 10B, 10C, 11A, 11B, 11C, 12A, 12B, and 12C illustrate cross-sectional views of various intermediary stages of manufacturing a semiconductor device in accordance with other embodiments.

Referring to FIG. 9, FIG. 9 illustrates an optional trimming process 130 on the semiconductor device 100 after the patterning of the upper layer 118 as illustrated in FIG. 1 to increase the size of the openings 122 in the upper layer 118 to produce a modified upper layer 318 and enlarged openings 126. The trimming process 130 may be performed to shrink the CD and repair side wall roughness.

In an embodiment, the optional trimming process 130 is an anisotropic plasma etch process with process gases including $O_2$, $CO_2$, $N_2O$, $N_2/H_2$, $H_2$, the like, a combination thereof, or any other gases suitable for trimming the upper layer 118. The trimming may increase the width $W_1$ of the openings 122 to the width $W_5$ of the openings 126 and decrease the width $W_2$ of the portions of the upper layer 118 between the openings 126 to the width $W_6$. The width $W_5$ of the openings 126 may be between about 6 nm and about 51 nm, such as about 11 nm. Correspondingly, the width $W_6$ of portions of the pattern 318 at its narrowest points may be between about 4 nm and about 49 nm, such as about 9 nm.

Figure 10A:
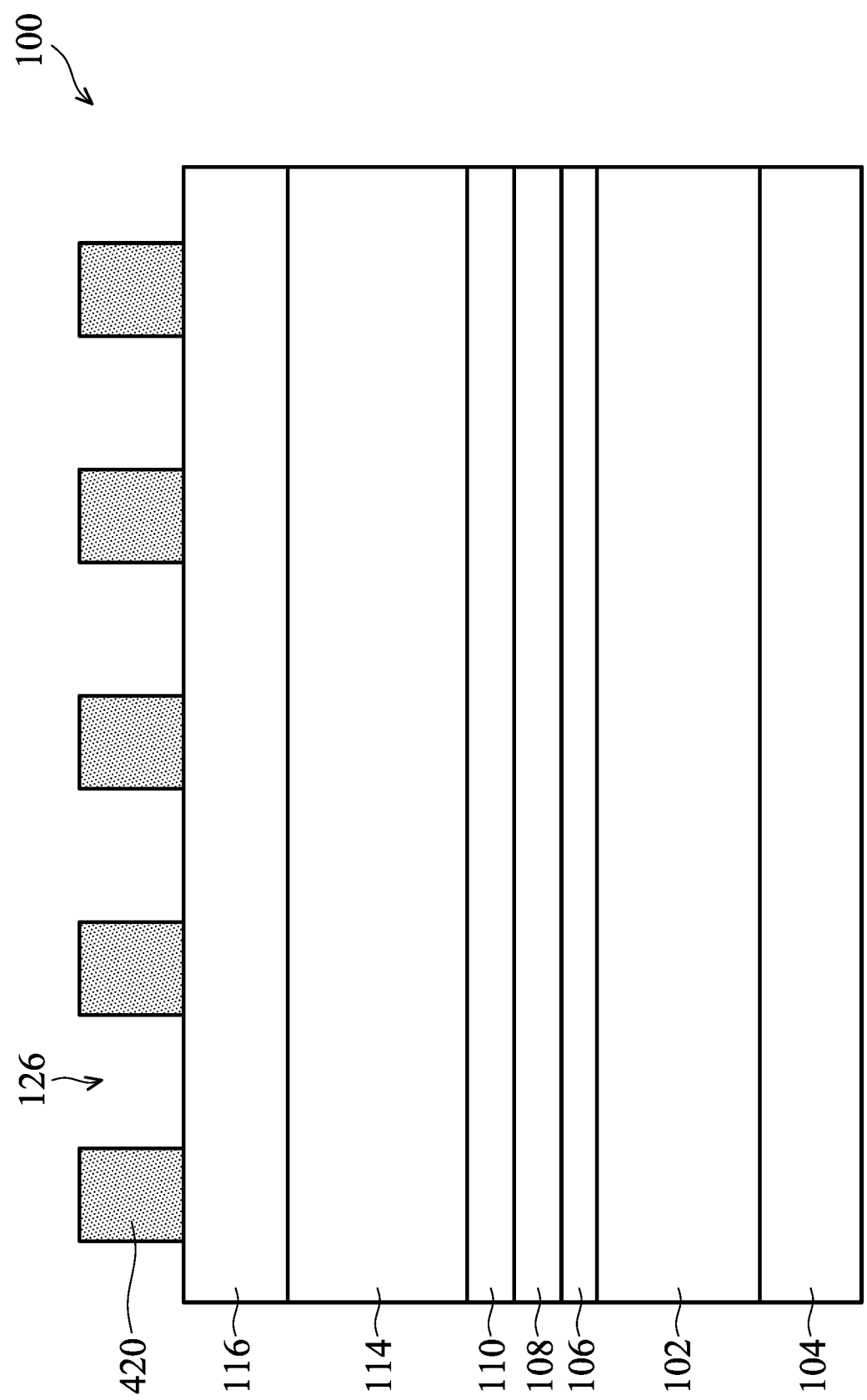
Figure 10B:
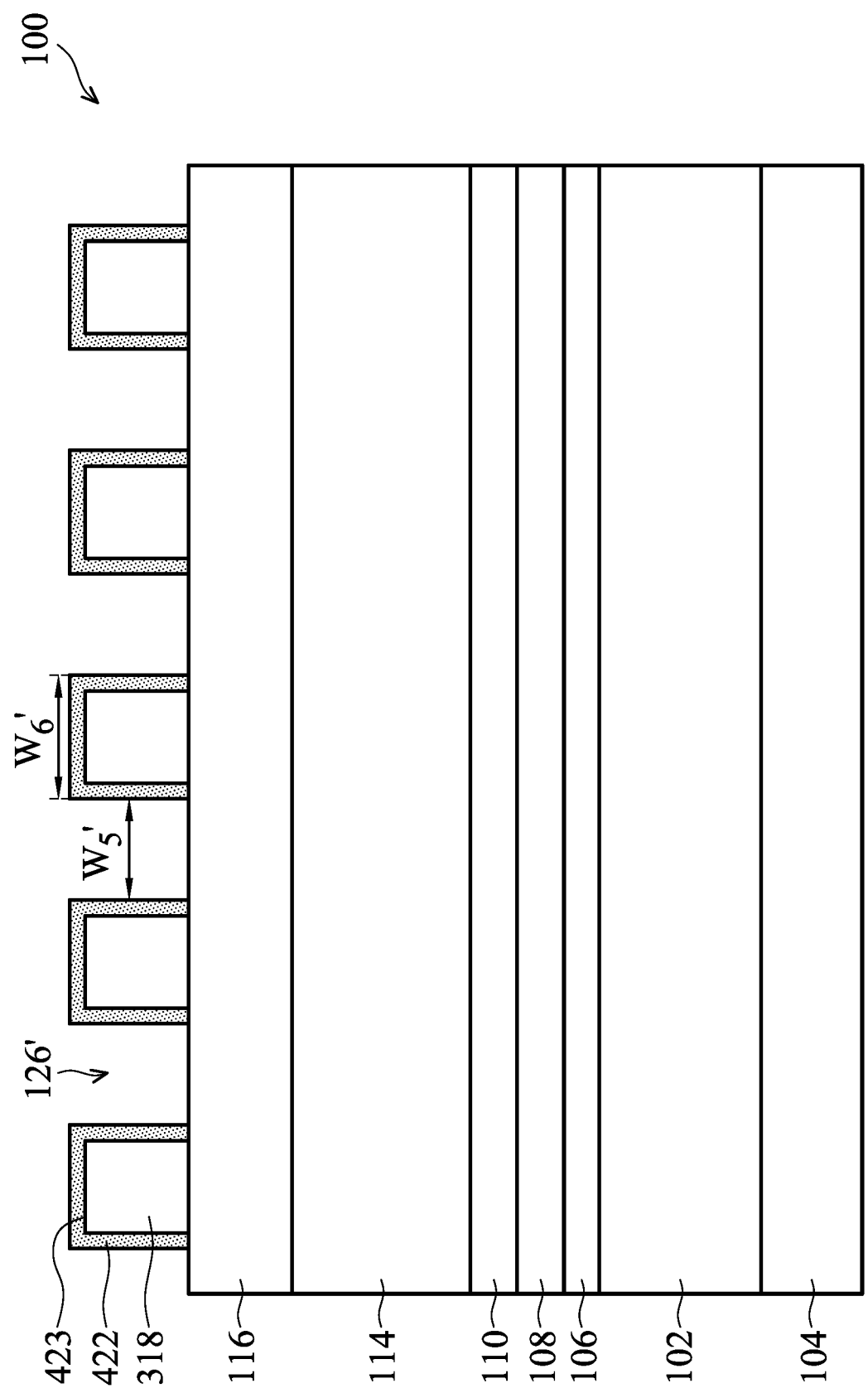
Figure 10C:
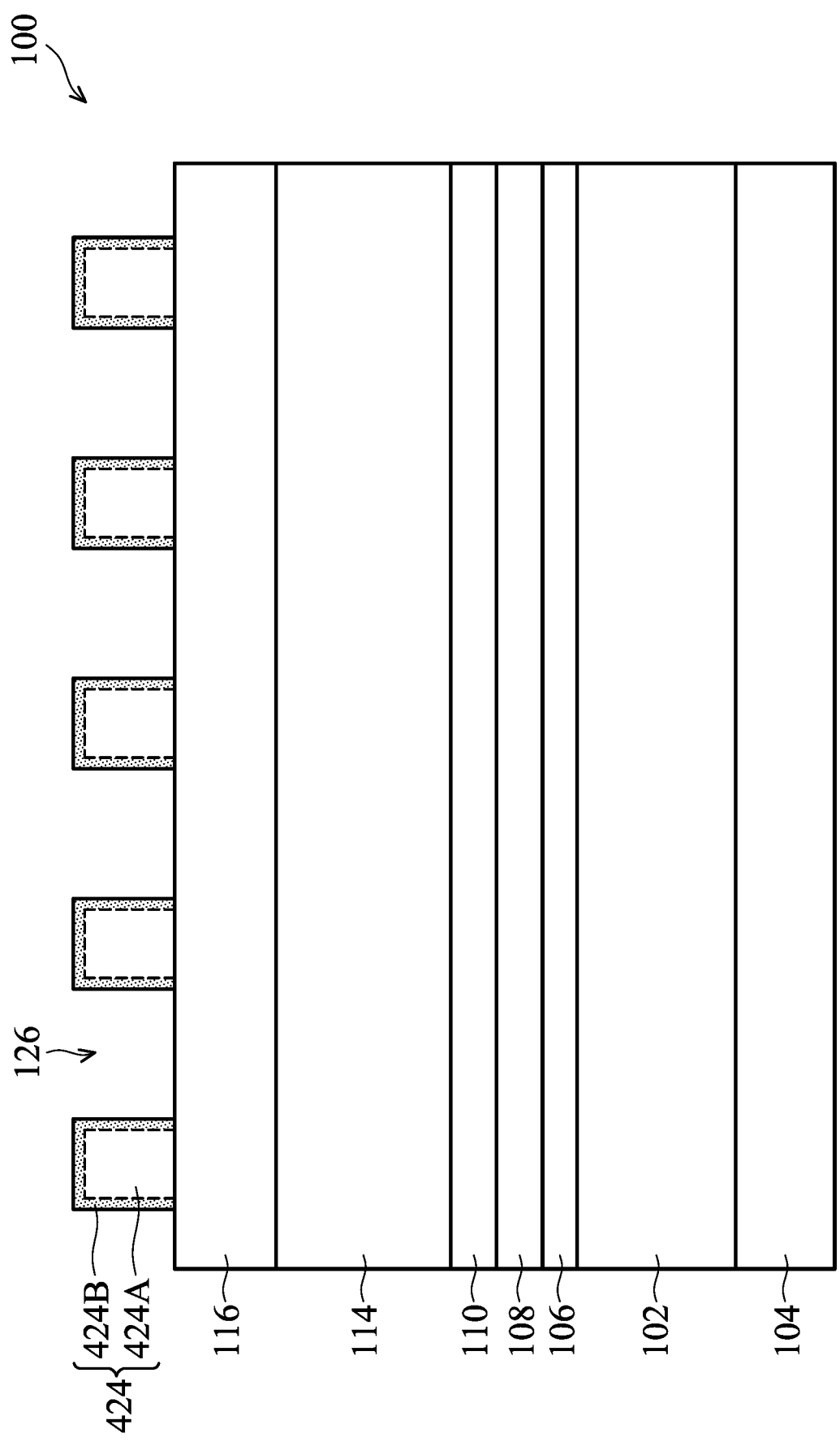

FIGS. 10A, 10B, and 10C illustrate three different morphologies of the upper layer 318 after the trimming process 130 in accordance with process embodiments. FIG. 10A illustrates a morphology of the upper layer 318 where the upper layer 318 is converted to a mask layer 420 comprising a uniform morphology of a metal-oxide-photoresist material. FIG. 10B illustrates a morphology of the upper layer 318 where a metal oxide crust 422 is formed which has a uniform cross-link 423 to the photoresist material of the upper layer 318. FIG. 10C illustrates a morphology of the upper layer 318 where the upper layer 318 is converted to a mask layer 424 having an outer layer 424B which is converted from the upper layer 318 to a metal-oxide-photoresist material and an inner layer 424A which is an unconverted portion of the upper layer 318.

In FIG. 10A, a thermal ALD process may be used to deposit a metal based composite material into the photoresist material of the upper layer 318, thereby converting the upper layer 318 into a mask layer 420. The upper layer 318 may be converted into the mask layer 420 using processes and materials similar to those described above with respect to FIG. 2A.

FIG. 10B illustrates a morphology of the upper layer 318 where a metal oxide crust 422 is formed which has a uniform cross-link 423 to the photoresist material of the upper layer 318. A thermal ALD process may be used to deposit a metal based composite material into a surface portion of the photoresist material of the upper layer 318, thereby forming a uniform cross-link 423 from the photoresist material of the upper layer 318 to the metal oxide crust 422. The metal oxide crust 422 and cross-link 423 may be formed using processes and materials similar to those described above with respect to FIG. 2B. The sidewall thickness of the metal oxide crust 422 encroaches into the openings 126 to create openings 126'. The metal oxide crust 422 effectively reduces the width of the openings 122 from $W_5$ (see FIG. 9) to $W_5'$ and correspondingly increases the effective width of the pattern from $W_6$ (see FIG. 9) to $W_5'$. In some embodiments $W_5'$ may be between about 4 nm and about 49 nm, such as about 9 nm, and $W_6'$ may be between about 6 nm and about 51 nm, such as about 11 nm. Other dimensions are contemplated.

In some embodiments, the metal oxide crust 422 can be formed over the photoresist material of the upper layer 318 without a uniform cross-link. In other words, the metal oxide crust 422 may be disposed on the surfaces of the upper layer 318 without converting any of the upper layer 318 into a carbon-metal-oxide inorganic material. In yet other embodiments, portions of the upper layer 318 may be converted into a carbon-metal-oxide inorganic material in a non-uniform manner.

FIG. 10C illustrates a morphology of the upper layer 318 into a mask layer 424 where a metal oxide crust 424B is formed by converting the surface regions of the upper layer 318 into a carbon-metal-oxide inorganic material while interior regions 424A of the upper layer 318 remain unconverted. A thermal ALD process may be used to deposit a metal based composite material into a surface portion of the photoresist material of the upper layer 318, thereby forming a carbon-metal-oxide crust 424B of mask 424 from the photoresist material of the upper layer 318 and a remaining unconverted portion 424A of the upper layer 318. The carbon-metal-oxide crust 424B may be formed using processes and materials similar to those described above with respect to FIG. 2C.

After conversion of the upper layer 318, process embodiments may produce species of mask 420 as discussed with respect to FIG. 10A, mask 318 with crust 422 as discussed with respect to FIG. 10B, mask 424 as discussed with respect to FIG. 10C, or combinations thereof. Embodiments use the metal based composite material to modify the composition of the photoresist material of the upper layer 318 to shrink the CD of the semiconductor device 100 and/or to enhance etch selectivity between the modified upper layer 318 (see FIGS. 10A-10C) and the middle layer 116.

Figure 11A:
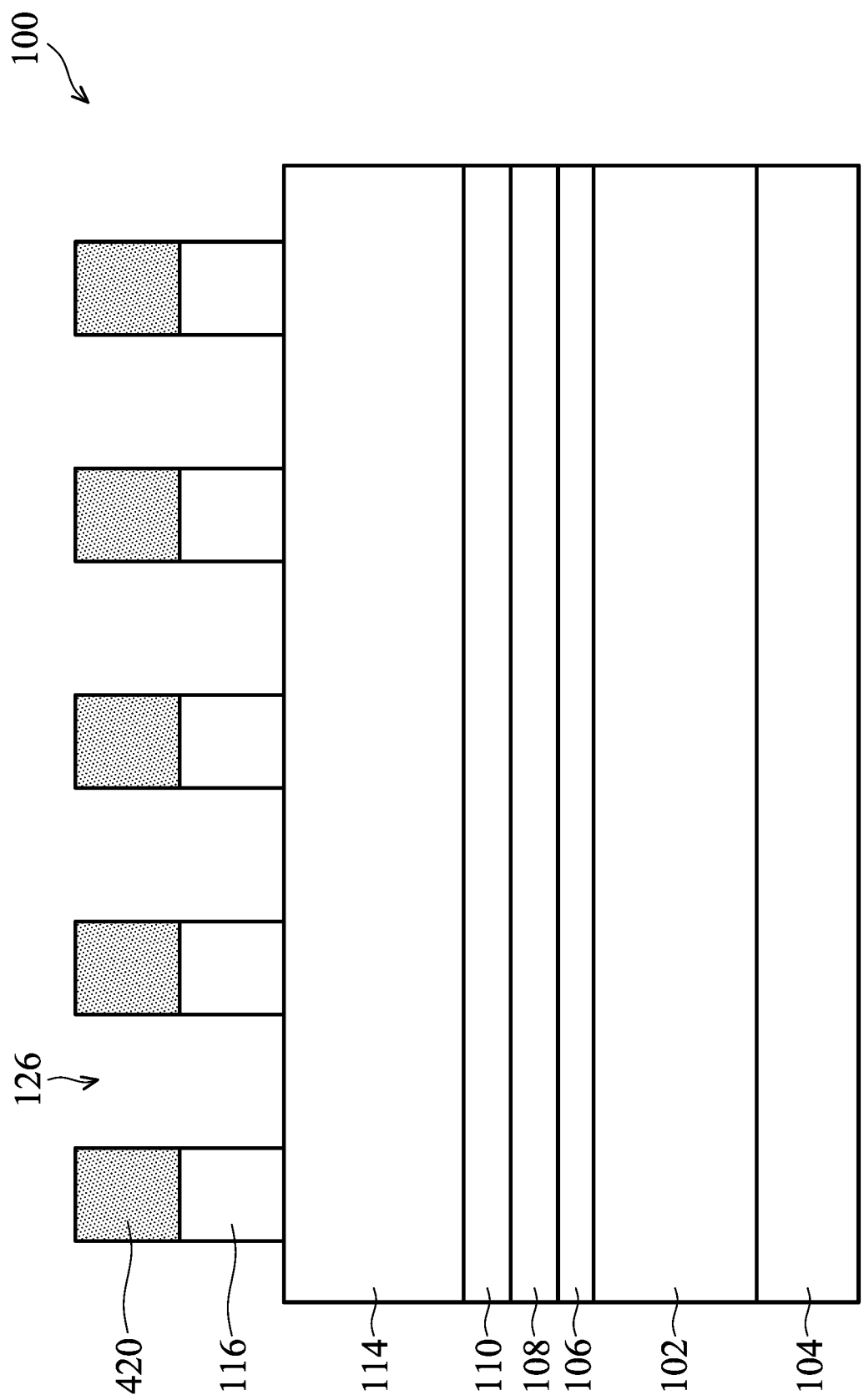
Figure 11B:
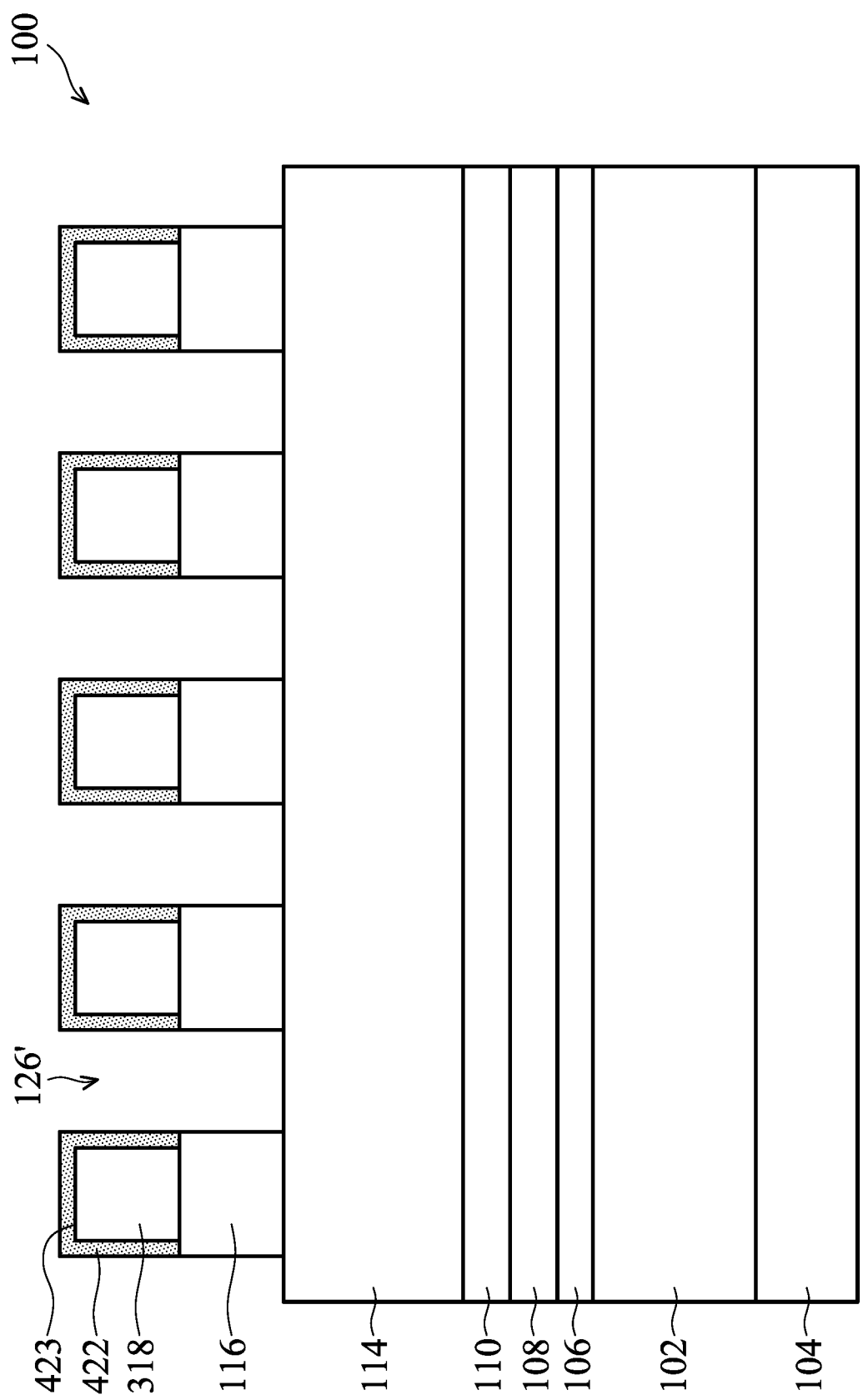
Figure 11C:
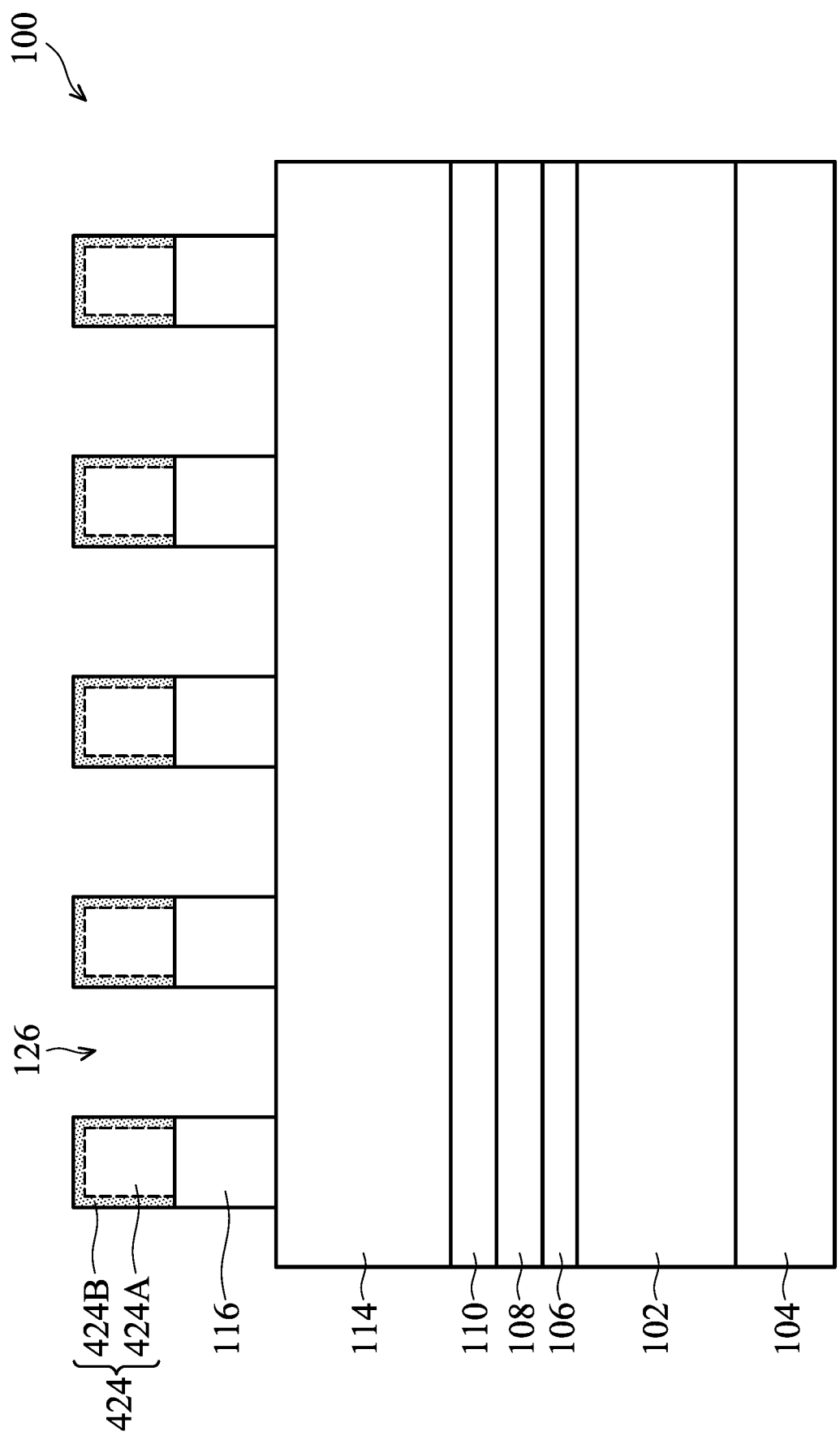

After the patterning of the upper layer 118, the trim process 130, and conversion of the upper layer 318 adding a metal composite material to the upper layer 318. FIGS. 11A, 11B, and 11C illustrate the transferring of the pattern of the upper layer 318 after conversion to the middle layer 116 in an etching process.

FIG. 11A illustrates transferring the pattern of the mask 420 to the middle layer 116. FIG. 11B illustrates transferring the pattern of the metal oxide crust 422 to the middle layer 116. FIG. 11C illustrates transferring the pattern of the mask 424 to the middle layer 116. The etching process is anisotropic, so that the openings 126 (or openings 126' for embodiments consistent with FIG. 10B) are extended through the middle layer 116 and have about the same sizes in the middle layer 116 as they do in the overlying layer—mask 420, metal oxide crust 422, mask 424, or combinations thereof.

Figure 12A:
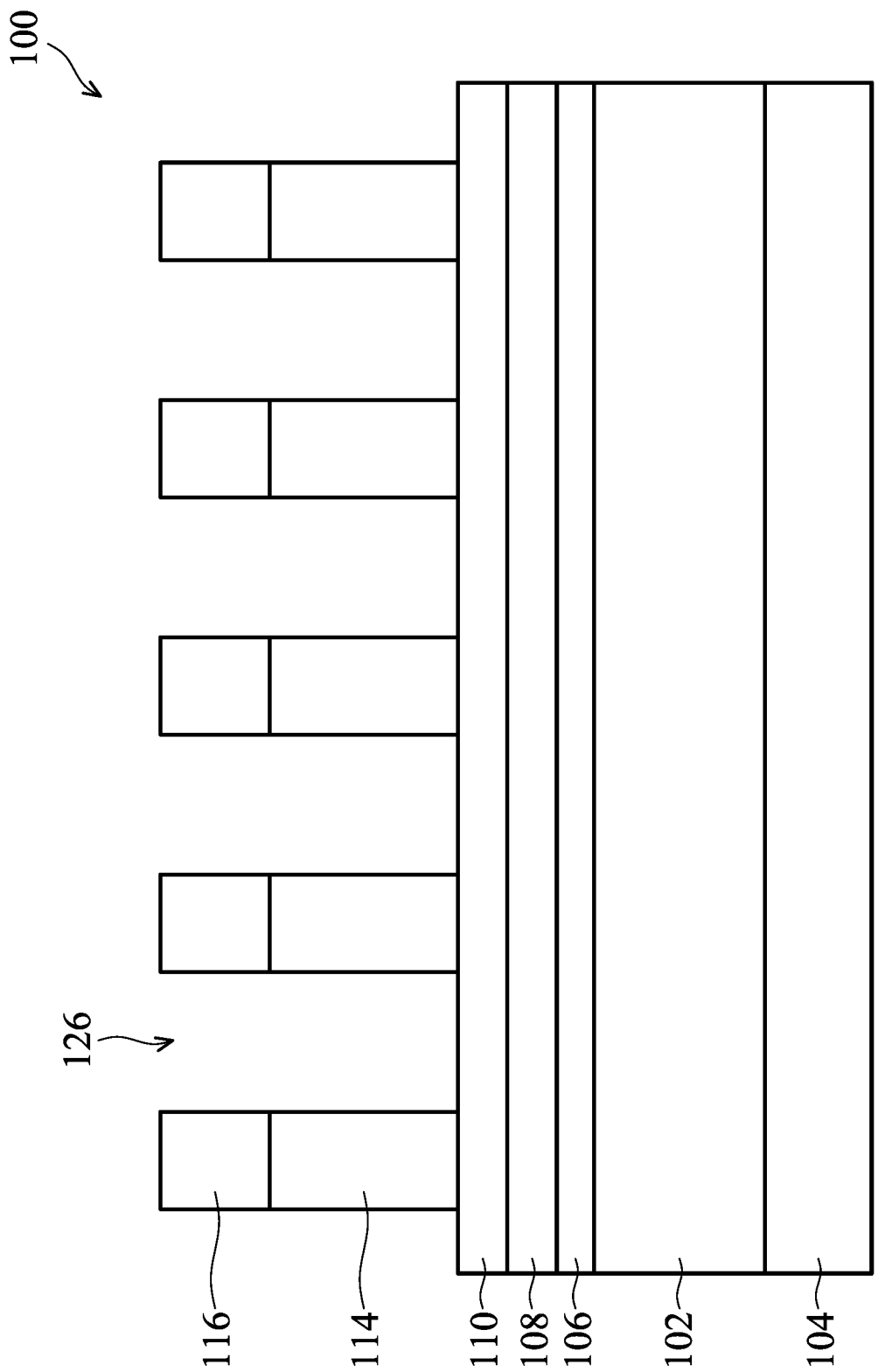
Figure 12B:
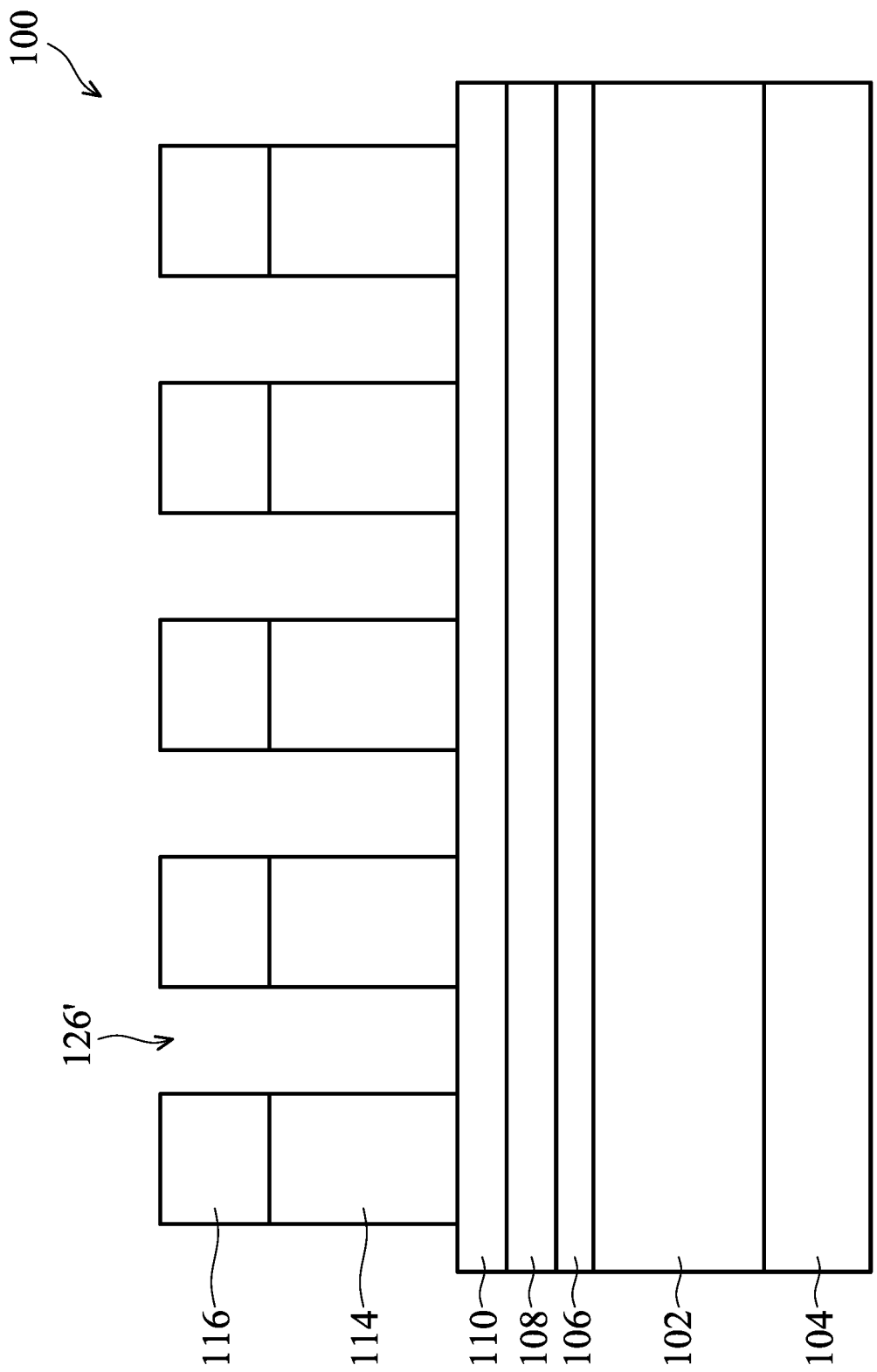
Figure 12C:
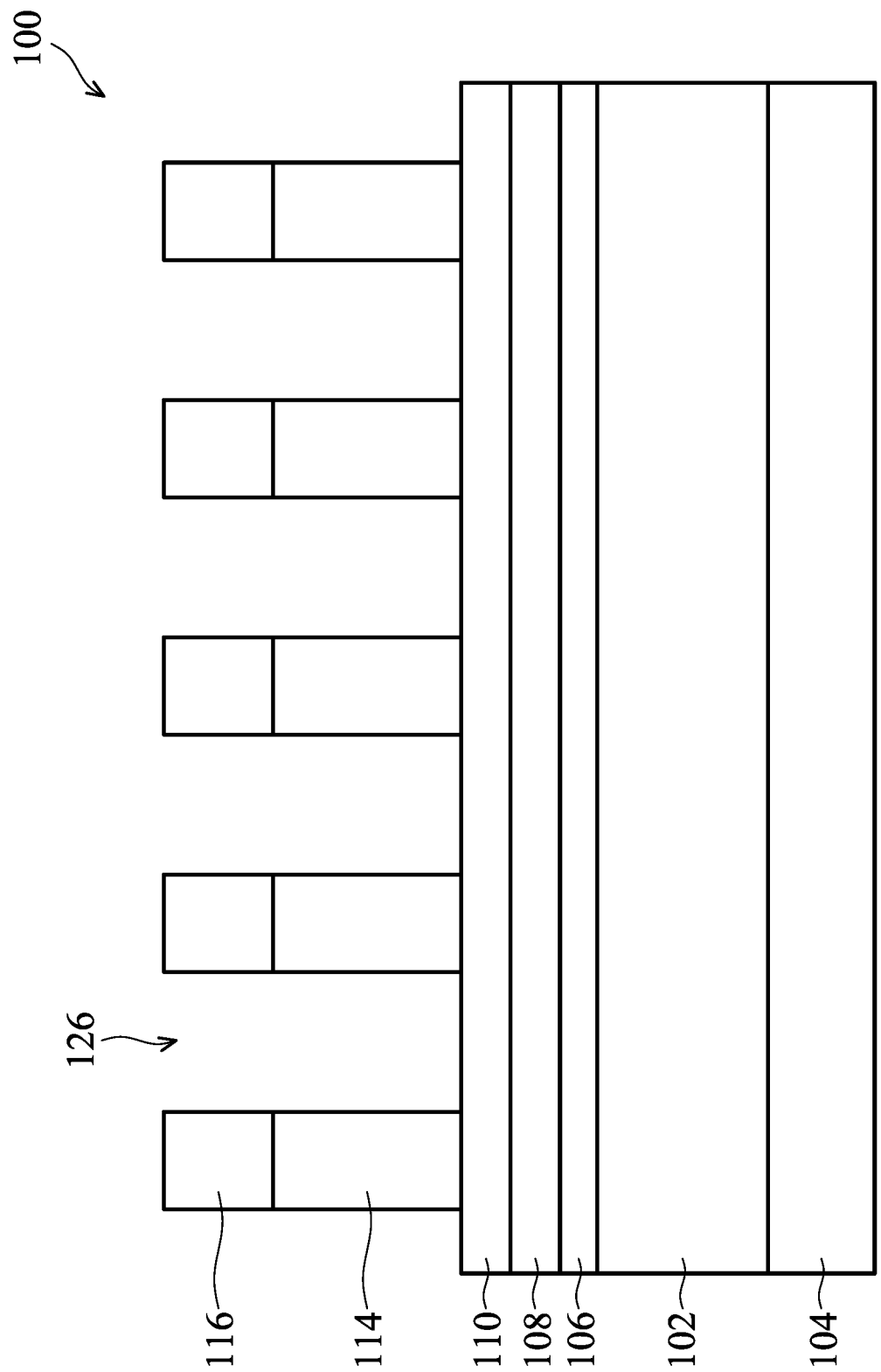

In FIGS. 12A, 12B, and 12C an etching process is performed to transfer the pattern of the middle layer 116 to the bottom layer 114, thereby extending the openings 126 (or openings 126' for embodiments consistent with FIG. 12B) through the bottom layer 114. The etching process of the bottom layer 114 is anisotropic, so that the openings 126 (or 126') in the middle layer 116 are extended through the bottom layer 114 and have about the same sizes in the bottom layer 114 as they do in the middle layer 116. As part of etching the bottom layer 114, the mask 420, carbon-metal-oxide crust 422 and upper layer 318, or the mask 424 (see FIGS. 10A-10C) may be consumed. In some embodiments, the mask 420, carbon-metal-oxide crust 422 and upper layer 318, or the mask 424 may be removed by a separate process prior to or after the etching of the bottom layer 114.

Figure 13:
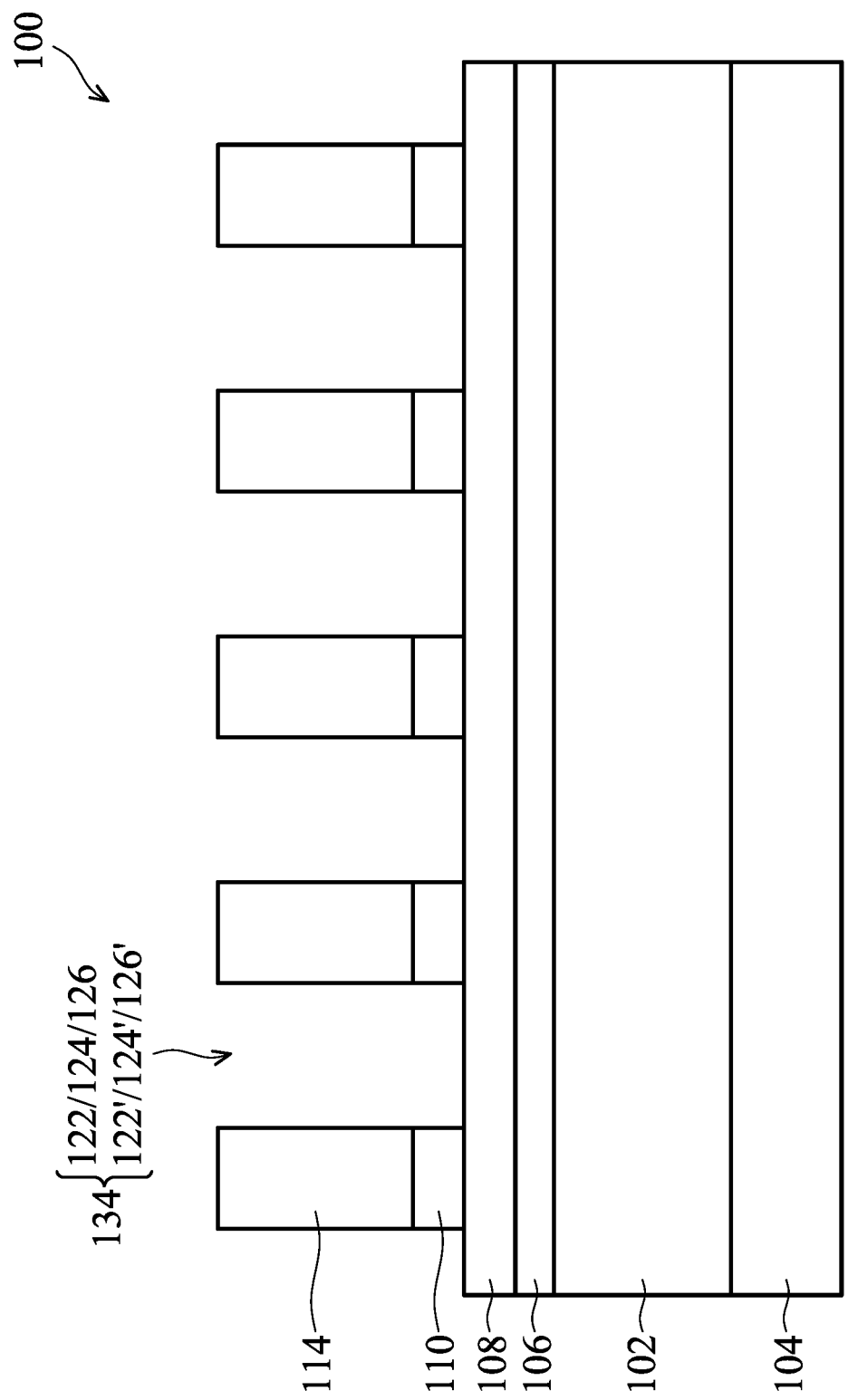
FIGS. 13, 14, 15, and 16 illustrate cross-sectional views of various intermediary stages of manufacturing a semiconductor device in accordance with some embodiments.
Figure 14:
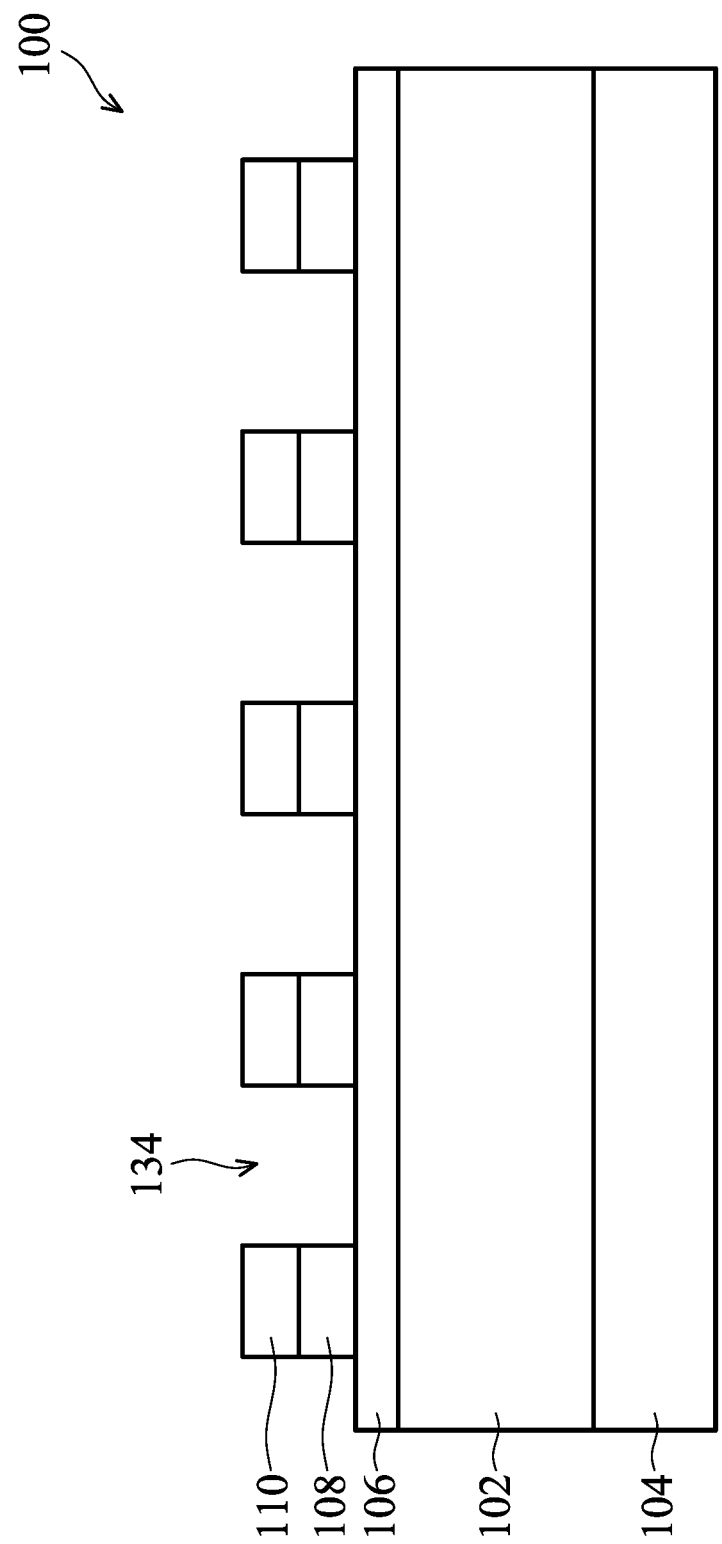
Figure 15:
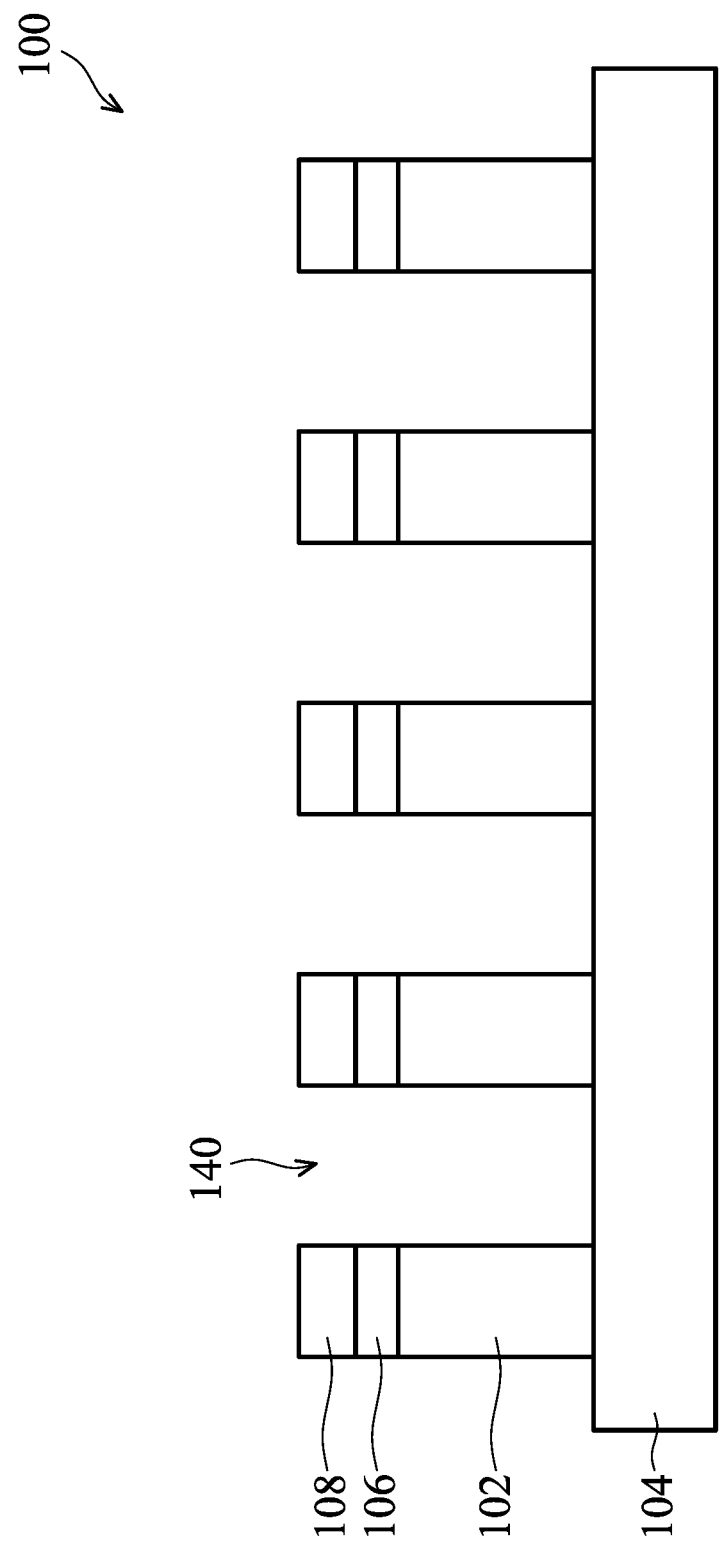
Figure 16:
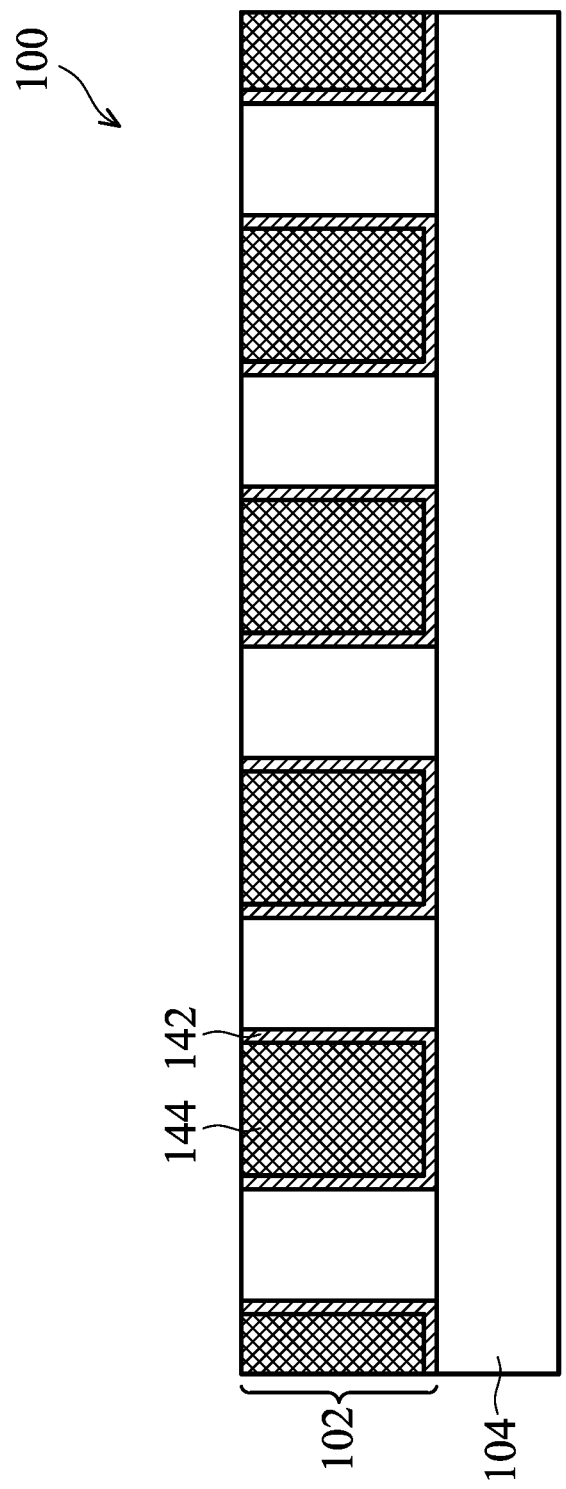
Figure 17:
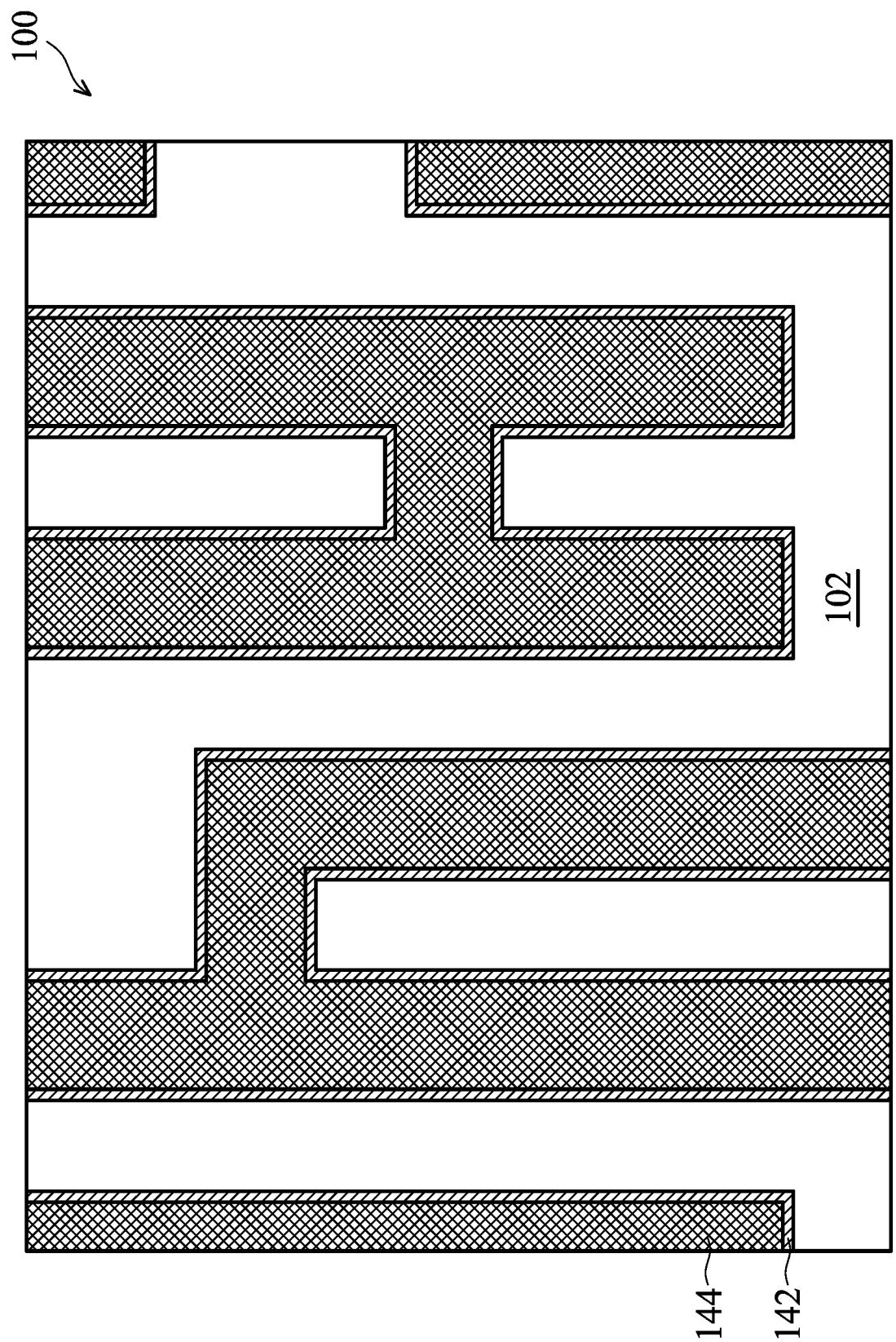
FIG. 17 illustrates a top down view of an intermediary stage of manufacturing a semiconductor device in accordance with some embodiments.

FIGS. 13 through 15 illustrate the continuing patterning of subsequent layers down to the target layer 102 by transferring the pattern in overlying layers to the underlying layers. FIG. 16 illustrates depositing features in the target layer 102. FIG. 17 is a plan view following the depositing of features in the target layer 102.

In FIG. 13, the pattern of the bottom layer 114 is transferred to the dielectric layer 110 using an etching process. The openings 134 in the bottom layer 114 include the openings 122 or 122' (see FIGS. 2A-2C), the openings 124 or 124' (see FIGS. 6A-6C), or the openings 126 or 126' (see FIGS. 10A-10C), depending on the embodiments used to process the bottom layer 114. The etching process of the dielectric layer 110 is anisotropic, so that the openings 134 in the bottom layer 114 are extended through the dielectric layer 110 and have about the same sizes in the dielectric layer 110 as they do in the bottom layer 114. During etching the dielectric layer 110, the middle layer 116 is consumed, and bottom layer 114 may be at least partially consumed. In embodiments when the bottom layer 114 is not completely consumed while etching the dielectric layer 110, an ashing process may be performed to remove remaining residue of the bottom layer 114.

In FIG. 14, the hard mask layer 108 is etched using the dielectric layer 110 as an etching mask. In some embodiments, etching the hard mask layer 108 comprises an anisotropic dry etch and/or wet etch. After the hard mask layer 108 is patterned, a wet cleaning may be performed to remove any remaining portions of the dielectric layer 110.

In FIG. 15, the ARC 106 and target layer 102 are sequentially etched using the hard mask layer 108 as an etching mask to extend openings 134 into the target layer 102 to create openings 140. Etching the target layer 102 may comprise an anisotropic dry etch process and/or a wet etch process, which sequentially etches through the ARC 106 to the target layer 102. After the openings 134 are patterned to form openings 140, a wet cleaning may be performed to remove any remaining portions of the hard mask layer 108 and the ARC 106.

After openings 140 are patterned in the target layer 102, features may be formed in the openings. In an embodiment, the target layer 102 is a low-k dielectric, and the patterned target layer 102 provides an IMD for an interconnect structure. Conductive features such as copper lines, copper vias, and/or cobalt plugs may be formed in the IMD layer as illustrated by FIG. 16. Forming the conductive features may include depositing one or more liners 142 along sidewalls and a bottom surface of the openings 140 (see FIG. 15). The liners 142 may comprise TiO, TiN, TaO, TaN, or the like and may provide diffusion barrier, adhesion, and/or seed layers for the conductive feature. The liners may be deposited using any suitable process, such as, PVD, CVD, ALD, and the like.

After the liners 142 are deposited, remaining portions of the opening may be filled with a conductive material 144, such as copper using, e.g., PVD, plating, or the like. The conductive material 144 may be initially deposited to overfill the openings 140 (see FIG. 15), and a planarization process performed to remove excess portions of the conductive material 144 over the target layer 102. Thus, conductive features may be formed in the target layer 102.

Referring to FIG. 17, a top down view of the device after the features have been formed in the target layer 102. FIG. 17 is a partial view of a pattern of conductive material 144 surrounded by liners 142.

By employing the embodiments discussed herein, conductive lines having spacing of 30 nm or less may be reliably formed with fewer manufacturing defects and increased yield in a single patterning process. In some embodiments, a multi-step patterning process can be used using the techniques discussed herein to pattern a mandrel layer (not shown), for example overlying the dielectric layer 110, which is then used to create mandrels which are used as an etch mask to further decrease the pitch.

In other embodiments where the target layer 102 is a conductive layer or a semiconductor layer, a reverse pattern of the hard mask layer 108 may be patterned in the target layer 102 using a similar process as described above with respect to FIG. 15. For example, an additional hard mask (not shown) may be deposited around the hard mask layer 108. The hard mask layer 108 is then removed, and the additional hard mask is used to pattern the target layer 102. The resulting patterned target layer 102 has a negative pattern than the pattern of the hard mask 108.

Various embodiments described above provide a patterning process, which uses a conversion of an organic photoresist layer to an inorganic photoresist layer to provide better etch selectivity between the photoresist layer and subsequent layers. This provides smoother line profiles with less line wiggle and provides the ability to achieve narrowly spaced conductive patterns in a single patterning process with better defect prevention in order to more reliably form a patterned target layer. Thus, fine patterned features can be formed in a target layer with fewer defects and increased yield.

One embodiment includes a method, including patterning a photoresist layer to form a mask layer, the mask layer including an organic material. A portion of the mask layer is converted to an inorganic material. A first layer is etched using the mask layer.

Another embodiment includes a method, including forming a photoresist layer over a target layer. The photoresist layer is patterned to form a mask, the mask including an organic material. A metal containing first precursor is applied to the mask. An oxygen containing second precursor is applied to the mask, where following applying the first precursor and second precursor, the mask includes an inorganic material.

Another embodiment includes a method including forming a patterned etch mask over a target layer. An inorganic material is introduced to the etch mask. The target layer is etched using the inorganic material to protect the etch mask during etching one or more layers between the etch mask and the target layer. Conductive features are formed in the target layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    patterning a photoresist layer to form a mask layer, the mask layer comprising an organic material, the mask layer disposed over a first layer;
    converting a portion of the mask layer to an inorganic material, the inorganic material disposed on horizontal surfaces and vertical surfaces of the mask layer; and
    etching the first layer using the inorganic material on the horizontal surfaces and the vertical surfaces of the mask layer as an etch mask.

2. The method of claim 1, further comprising:
    before converting the portion of the mask layer, performing a de-scum process, the de-scum process removing material from sidewall portions of the mask layer and removing material from exposed portions of the first layer.

3. The method of claim 1, further comprising:
    before converting the portion of the mask layer, performing a trim process, the trim process removing material from sidewall surfaces and upper surfaces of the mask layer.

4. The method of claim 1, wherein converting the portion of the mask layer comprises:
    depositing a metal oxide into the mask layer by an atomic layer deposition (ALD) process.

5. The method of claim 1, wherein converting the portion of the mask layer comprises:
altering the mask layer to convert the mask layer to a carbon-metal-oxide material.

6. The method of claim 1, wherein converting the portion of the mask layer comprises:
forming a metal oxide crust over the mask layer.

7. The method of claim 6, further comprising:
forming a uniform crosslink of a carbon-metal-oxide at an interface of the metal oxide crust and the mask layer.

8. The method of claim 1, wherein converting the portion of the mask layer comprises:
forming a carbon-metal-oxide crust at surfaces of the mask layer.

9. A method, comprising:
forming a photoresist layer over a target layer;
patterning the photoresist layer to form a mask, the mask comprising an organic material, portions of an underlayer directly beneath the mask exposed by the patterning;
applying a metal containing first precursor to the mask, the metal containing first precursor reacting with the mask without depositing on the underlayer; and
applying an oxygen containing second precursor to the mask, wherein following applying the first precursor and second precursor, the mask comprises an inorganic material.

10. The method of claim 9, wherein the first precursor comprises:
trimethylaluminum (TMA, Al(CH$_3$)$_3$), diethylzinc (DEZ), tetrakis (dimethylamino) titanium (TDMAT), titanium isopropoxide (TTIP), TiCl$_4$, bis(tertiary-butyl-amino) silane (BTBAS), bis(diethylamino)silane (BDEAS), tris(dimethylamino)silane (3DMAS), tetrakis(dimethylamido)zirconium (Zr(NMe$_2$)$_4$), zirconium tetrachloride (ZrCl$_4$), or tetrakis-dimethyl-amine tin (TDMASn).

11. The method of claim 10, wherein the second precursor comprises H$_2$O, O$_2$, O$_3$, or H$_2$O$_2$.

12. The method of claim 9, further comprising:
prior to applying the first precursor, performing a de-scum process on the mask.

13. The method of claim 9, further comprising:
prior to applying the first precursor, performing a trim process on the mask.

14. The method of claim 9, further comprising:
forming a metal oxide crust over surfaces of the mask.

15. The method of claim 14, further comprising:
forming a crosslink between the metal oxide crust and an organic portion of the mask.

16. The method of claim 9, wherein following applying the first precursor and the second precursor, surfaces of the mask comprise a carbon-metal-oxide.

17. A method comprising:
forming a patterned etch mask over a target layer;
introducing an inorganic material to the etch mask;
etching the target layer, using the inorganic material to protect the etch mask during etching one or more layers between the etch mask and the target layer; and
forming conductive features in the target layer.

18. The method of claim 17, wherein introducing the inorganic material to the etch mask comprises:
depositing a metal oxide into the etch mask; and
transforming carbon-oxygen bonds of the etch mask into carbon-metal-oxygen bonds.

19. The method of claim 17, a portion of the etch mask including inorganic material comprises an entire thickness of the etch mask.

20. The method of claim 17, wherein a portion of the etch mask including inorganic material includes surfaces of the etch mask, wherein a portion of the etch mask underlying the inorganic material has no inorganic material.

* * * * *